United States Patent
Yang et al.

(10) Patent No.: US 11,476,446 B2
(45) Date of Patent: Oct. 18, 2022

(54) DISPLAY DEVICE AND MANUFACTURING METHOD THEREOF

(71) Applicant: Samsung Display Co., Ltd., Yongin-Si (KR)

(72) Inventors: Sung-Jin Yang, Cheonan-si (KR); Chungi You, Asan-si (KR); Hyunsik Park, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 190 days.

(21) Appl. No.: 16/783,813

(22) Filed: Feb. 6, 2020

(65) Prior Publication Data
US 2020/0259123 A1    Aug. 13, 2020

(30) Foreign Application Priority Data
Feb. 7, 2019   (KR) .................. 10-2019-0014355

(51) Int. Cl.
| | |
|---|---|
| *H01L 51/52* | (2006.01) |
| *H01L 27/32* | (2006.01) |
| *G02B 30/22* | (2020.01) |
| *G02B 5/18* | (2006.01) |
| *H01L 51/56* | (2006.01) |

(52) U.S. Cl.
CPC ........ *H01L 51/5262* (2013.01); *G02B 5/1842* (2013.01); *G02B 5/1857* (2013.01); *G02B 30/22* (2020.01); *H01L 51/524* (2013.01); *H01L 51/5253* (2013.01); *H01L 51/56* (2013.01); *H01L 27/323* (2013.01); *H01L 51/5281* (2013.01)

(58) Field of Classification Search
CPC .............. G02B 27/0944; G02B 5/1842; G02B 30/22–25; H01L 51/5262
See application file for complete search history.

(56) References Cited

U.S. PATENT DOCUMENTS

| | | |
|---|---|---|
| 10,062,870 B2 | 8/2018 | Sasaki |
| 2006/0006778 A1 | 1/2006 | Lee et al. |
| 2012/0286258 A1 | 11/2012 | Naraoka et al. |
| 2017/0155093 A1 | 6/2017 | Jo |
| 2017/0250376 A1* | 8/2017 | Sasaki ................. H01L 51/5253 |
| 2018/0149872 A1 | 5/2018 | Choi et al. |
| 2018/0314067 A1* | 11/2018 | Cho .................... H01L 51/5012 |

(Continued)

FOREIGN PATENT DOCUMENTS

| | | | | |
|---|---|---|---|---|
| CN | 108807467 A | * | 11/2018 | ......... H01L 51/0096 |
| JP | 5711726 | | 5/2015 | |
| KR | 10-0852110 | | 8/2008 | |

(Continued)

*Primary Examiner* — Mariceli Santiago
(74) *Attorney, Agent, or Firm* — F. Chau & Associates, LLC

(57) ABSTRACT

A display device comprising a display module configured to define a display surface. The display module includes a display panel including a plurality of display elements configured to display an image on the display surface. A plurality of diffraction patterns are spaced apart on the display panel at a constant interval. The diffraction patterns are configured to diffract at least some light beams emitted from the plurality of display elements. The plurality of diffraction patterns comprise an organic material.

14 Claims, 24 Drawing Sheets

(56) References Cited

U.S. PATENT DOCUMENTS

2019/0088904 A1* 3/2019 Cho .................. G02B 27/4205
2019/0094541 A1* 3/2019 Choi ................... G02B 5/1871

FOREIGN PATENT DOCUMENTS

| KR | 10-174268 | 6/2017 | | |
|---|---|---|---|---|
| KR | 10-2018-0061467 | 6/2018 | | |
| KR | 10-1897876 | 9/2018 | | |
| KR | 10-2018-0121750 | 11/2018 | | |
| KR | 10-2019-0033116 | 3/2019 | | |
| WO | WO-2018098868 A1 * | 6/2018 | ............ | G02B 27/30 |

* cited by examiner

DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2019-014355, filed on Feb. 7, 2019, the disclosure of which is incorporated by reference in its entirety herein.

1. TECHNICAL FIELD

The present disclosure herein relates to a display device and a manufacturing method thereof. More particularly, the present disclosure herein relates to a display device having an improved display quality and a manufacturing method of a display device having improved efficiency.

2. DISCUSSION OF RELATED ART

Display devices have become increasingly important with the development of multimedia technology and presentations. Various types of display devices such as a liquid crystal display (LCD) and an organic light emitting display (OLED) are commonly used for multimedia devices.

An LCD, an OLED, and the like may be incorporated into a head mounted display (HMD). For example, an HMD may be mounted on a user's head and have the form of a pair of glasses, a helmet or the like. The HMD displays an image in front of the user's eyes so that the user may view the displayed image.

SUMMARY

The present disclosure provides a display device, which includes a plurality of diffraction patterns, and is manufactured by a simplified manufacturing process in which diffraction patterns are formed using an organic material to reduce the number of process steps of forming the diffraction patterns and a process step in which the diffraction patterns and a sealing member may be damaged is omitted in the process of forming the diffraction patterns, thereby improving display quality.

An embodiment of the inventive concept provides a display device comprising a display module configured to define a display surface. The display module includes a display panel including a plurality of display elements configured to display an image on the display surface. A plurality of diffraction patterns are spaced apart on the display panel at a constant interval. The diffraction patterns are configured to diffract at least some light beams emitted from the plurality of display elements. The plurality of diffraction patterns comprise an organic material.

In an embodiment, the at least some of the light beams diffracted by the diffraction patterns may interfere constructively.

In an embodiment, the plurality of display elements may respectively display pixel unit images on the display surface, the light beams that have interfered constructively may display one or more duplicate unit images on the display surface, the image may be defined by the pixel unit images and the duplicate unit images, and each of the duplicate unit images may be displayed between the pixel unit images next to each other on the display surface.

In an embodiment, each of the plurality of display elements may include an organic light emitting element.

In an embodiment, the display device may further include an encapsulation layer disposed between the plurality of display elements and the plurality of diffraction patterns.

In an embodiment, the encapsulation layer may include at least one of an organic layer or an inorganic layer.

In an embodiment, the encapsulation layer may be a glass substrate.

In an embodiment, the display device may further include an optical system disposed in a path of light emitted from the display module to enlarge the image. The display surface may include a left eye image display region and a right eye image display region.

In an embodiment, the plurality of diffraction patterns, when viewed in a plane, may be arranged side by side so as to have a constant interval in a first direction and a second direction crossing the first direction.

In an embodiment, the plurality of diffraction patterns, when viewed in a plane, may be arranged side by side at constant intervals in a first direction, and may be alternately arranged in a second direction crossing the first direction.

In an embodiment, the display device may further include an inorganic film configured to cover the plurality of diffraction patterns.

In an embodiment, each of the plurality of diffraction patterns may have a cylindrical shape, a square pillar shape, or an engraved cylindrical shape.

In an embodiment, the plurality of diffraction patterns may be arranged at first intervals in a first direction, and the plurality of display elements may be arranged at second intervals in the first direction, and each of the first intervals may be smaller than each of the second intervals.

In an embodiment, the display device may further include a cover layer configured to cover the plurality of diffraction patterns and planarize a top of the plurality of diffraction patterns.

In an embodiment of the inventive concept, a manufacturing method of a display device includes forming a plurality of display elements on a substrate, forming an encapsulation layer that is configured to cover the plurality of display elements, coating a top surface of the encapsulation layer with an organic material to form an organic film, and patterning the organic film to form a plurality of diffraction patterns.

In an embodiment, the patterning of the organic film may include forming the plurality of diffraction patterns by exposing the organic layer to light and then developing the exposed organic layer.

In an embodiment, the patterning of the organic film may include forming the plurality of diffraction patterns so that the plurality of diffraction patterns have a constant interval in a first direction and a second direction crossing the first direction.

In an embodiment, the manufacturing method may further include forming an inorganic film by depositing an inorganic material on the plurality of diffraction patterns.

In an embodiment, the organic material may include a photosensitive material.

BRIEF DESCRIPTION OF THE DRAWINGS

The accompanying drawings are included to provide a further understanding of the exemplary embodiments of the present inventive concepts, and are incorporated in and constitute a part of this specification. The drawings illustrate exemplary embodiments of the present inventive concepts and, together with the description, serve to describe principles of the inventive concepts. In the drawings.

DETAILED DESCRIPTION OF THE EXEMPLARY EMBODIMENTS

Figure 1:
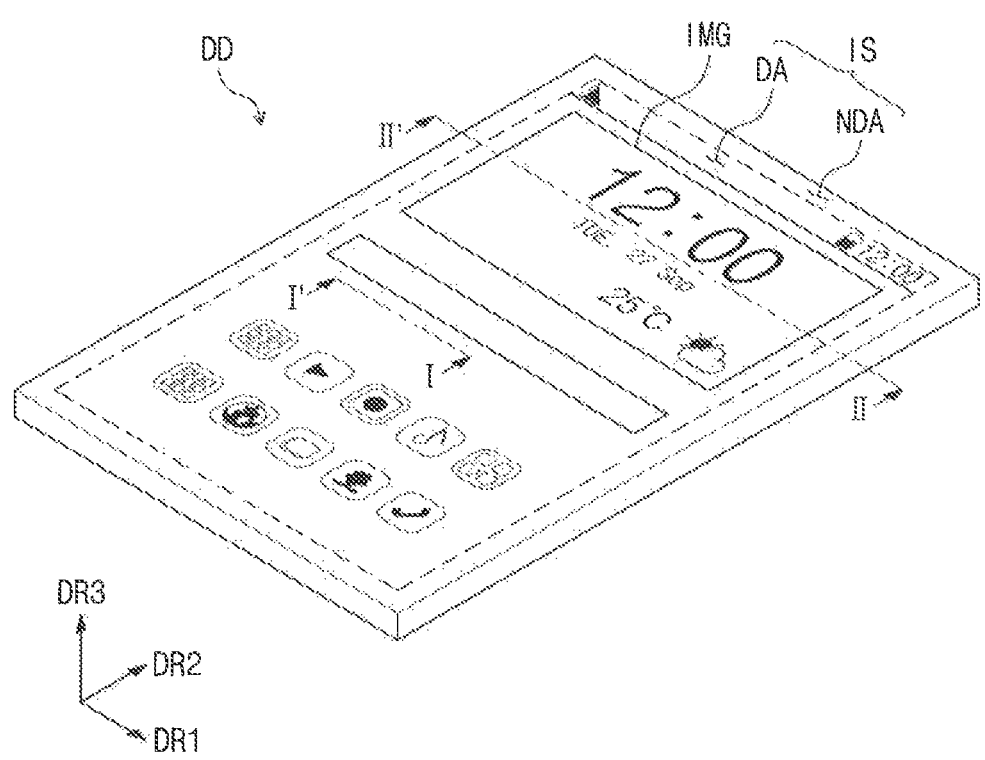
FIG. 1 is a perspective view of a display device according to an exemplary embodiment of the present inventive concepts.

Hereinafter, exemplary embodiments of the present inventive concepts will be explained in detail with reference to the accompanying drawings. As the inventive concepts may have various changes and modifications made thereto and take many forms, specific exemplary embodiments of the present inventive concepts are illustrated in the accompanying drawings and are hereinafter described in detail. However, it should be understood that this is not intended to limit the present inventive concepts to specific disclosures, but is intended to include all changes and modifications, equivalents, and substitutes within the spirit and scope of the present inventive concepts.

Like reference numerals refer to like elements when the figures are described throughout this specification. Also, in the figures, the dimensions of components may be exaggerated or reduced for effective description of the features. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention. As used herein, the singular forms, "a", "an" and "the" are intended to include the plural forms as well, unless the context clearly indicates otherwise.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

It will also be understood that when a layer (or film, region, substrate, and the like) is referred to as being "on" or "on top of" another layer or substrate, it can be directly on the other layer or substrate, or intervening layers may also be present. Further, it will be understood that when a layer (or film, region, substrate, and the like) is referred to as being "below" or "on the bottom of" another layer, it can be directly under, or one or more intervening layers may also be present. Also, when an element or layer is referred to as being disposed "on" another element or layer, it can be disposed not only on an upper portion of the other element or layer, but also on a lower portion thereof.

When a layer, film, region, or substrate is referred to as being/coming "in direct contact with" other element, this may mean that there are no intervening layers, films, regions, or substrates present. For example, "in direct contact with" may mean disposing two layers or two members in direct contact with each other without the use of an additional member such as an adhesive member.

Hereinafter, a display device according to an exemplary embodiment of the present inventive concepts will be described with reference to the accompanying drawings.

Figure 2:
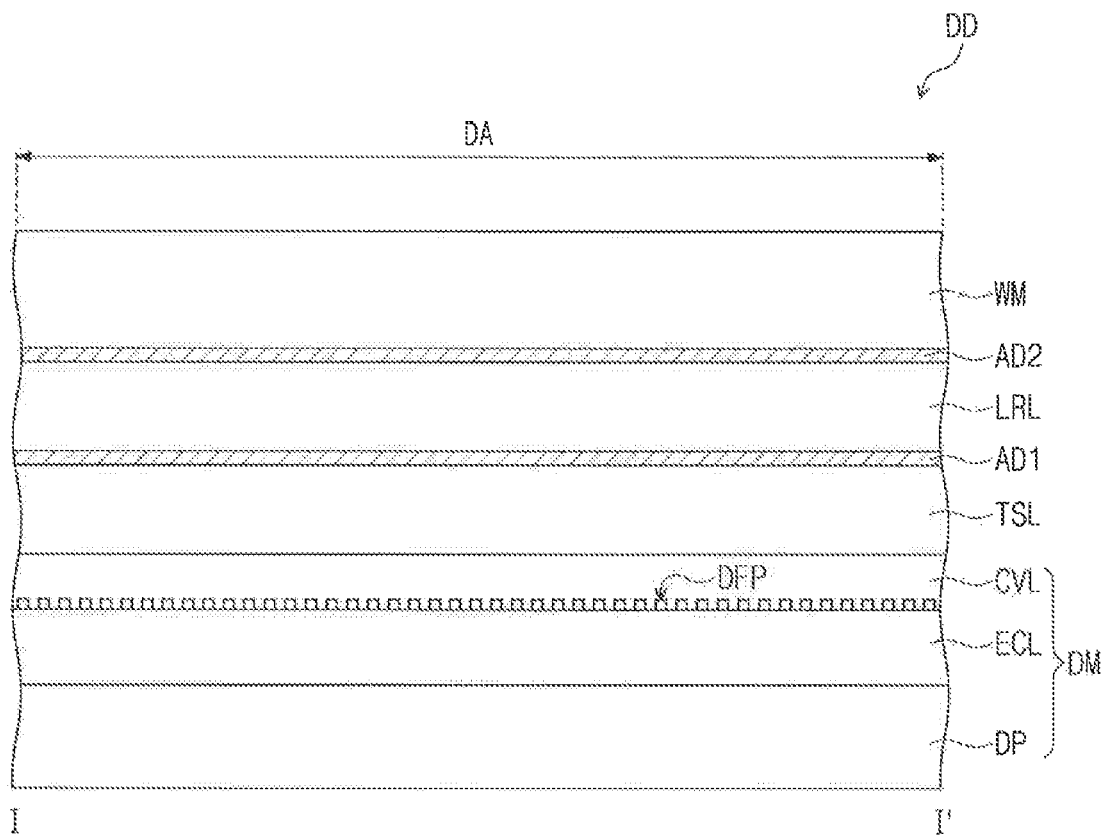
FIG. 2 is a cross-sectional view of the display panel illustrated in FIG. 1 taken along line I-I' according to an exemplary embodiment of the present inventive concepts.
Figure 2:
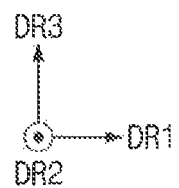

FIG. 1 is a perspective view of a display device according to an exemplary embodiment of the present inventive concepts. FIG. 2 is a cross-sectional view taken along line I-I' illustrated in FIG. 1.

Referring to FIGS. 1 and 2, a display device DD according to an exemplary embodiment of the inventive concepts may have a rectangular shape having a relatively short side in a first direction DR1 and a long side in a second direction DR2 perpendicular to the first direction DR1. However, the rectangular shape of the display panel is provided for convenience of description and exemplary embodiments of the present inventive concepts are not limited to a particular shape of the display device DD.

The display device DD may include a display surface IS having a display region DA and a non-display region NDA in a plane defined by the first direction DR1 and the second direction DR2. The display region DA may be positioned in a central region of the display device DD. The display region DA may display an image IMG. The non-display region NDA may have a frame which surrounds the display region DA in the plane of the first direction DR1 and second direction DR2. The non-display region NDA may not be configured to display an image. Exemplary embodiments of the present inventive concepts are not limited to particular shapes of the display region DA and the non-display region NDA.

A normal direction of the display surface IS, which is the general direction in which the image IMG is displayed may be indicated by a third direction DR3. A front surface (e.g., the top surface) and a rear surface (e.g., the bottom surface) of each of the layers or units described below may be distinguished by the third direction DR3. However, the first to third directions DR1 to DR3 illustrated in this exemplary embodiment are a relative concept, and may be converted into other directions in other embodiments. Hereinafter, first to third directions are defined as directions indicated by the first to third directions DR1 to DR3 respectively, and refer to the same reference numerals.

As shown in FIG. 2, the display device DD may include a display module DM. The display surface IS may be defined substantially on a top surface of the display module DM. The display module DM may include a display panel DP having a plurality of display elements for displaying an image, an encapsulation layer ECL disposed on the display panel DP, and a plurality of diffraction patterns DFP. The display panel DP, the encapsulation layer ECL, and the plurality of diffraction patterns DFP will be described in more detail with reference to FIGS. 3 to 15.

The display module DM according to an exemplary embodiment of the present inventive concepts may further include a cover layer CVL disposed on the diffraction patterns DFP. The cover layer CVL may cover the diffraction patterns DFP. In this exemplary embodiment, the cover layer CVL may perform a planarization function and provide protection for the diffraction patterns DFP.

The display device DD according to this exemplary embodiment may further include an input sensing layer TSL, an anti-reflection layer LRL, and a window member WM.

The input sensing layer TSL may be disposed on the display module DM. The input sensing layer TSL may detect an external input provided to the display device DD.

By way of example, the input sensing layer TSL may detect an external input that is inputted through a part of a user's body, such as the user's linger. However, the external input detectable by the input sensing layer TSL is not limited to any one method. For example, the external input may be inputted by an optical method, a touch method, a magnetic method, etc. A plurality of input sensing electrodes for sensing an external input may be included in the input sensing layer TSL The input sensing layer TSL may detect an external input in a variety of methods. By way of example, the input sensing layer TSL may be driven in a capacitive method, a resistance film method, a coordinate detection method, or the like.

The anti-reflection layer LRL may be disposed on the input sensing layer TSL. The anti-reflection layer LRL may be disposed to overlap the display region DA of the display device DD, such as in a plane defined by the first direction DR1 and second direction DR2. The anti-reflection layer LRL may improve image quality by preventing external light incident from the outside on the display device DD from being reflected by the display module DM and viewed by the user. A polarization layer and a phase retardation layer may be included in the anti-reflection layer LRL.

The polarization layer may have a transmission axis and an absorption axis perpendicular to the transmission axis. A first component of external light incident on the polarization layer may be absorbed or reflected by the absorption axis and may not pass through the polarization layer. A second component of the external light that is perpendicular to the first component and is incident on the polarization layer may pass through the polarization layer. The polarization layer linearly polarizes the external light.

In this exemplary embodiment, the polarization layer may be constituted of a polymer resin stretched in a specific direction. However, exemplary embodiments of the present inventive concepts are not limited to a particular type of the polarization layer. In another exemplary embodiment of the present inventive concepts, a polarization layer may be a wire grid polarizer.

The phase retardation layer may be disposed on the bottom of the polarization layer. The phase retardation layer may have optical anisotropy. Accordingly, the phase retardation layer may delay the phase of one component of incident light. The phase retardation layer changes the polarization state of light. By way of example, the phase retardation layer may delay the phase of one component of incident light by $\lambda/4$. The phase retardation layer may be a quarter wavelength film. Accordingly, the phase of one component of light passing through the phase retardation layer may be delayed, so that the light passing through the phase retardation layer may be changed from a linear polarization state to a circular polarization state or vice versa.

According to this exemplary embodiment, even if external light incident from the outside on the display device DD is reflected by the display module DM, the polarization state of the reflected external light may be changed by the phase retardation layer so that the reflected external light may be absorbed or reflected by the polarization layer. Accordingly, the external light reflected by the display module DM may not be transmitted through the display surface IS of the display device DD to the viewer.

The window member WM may be disposed on top of the anti-reflection layer LRL. The window member WM forms a front surface of the display device DD, and provides protection for the anti-reflection layer LRL, the input sensing layer TSL, and the display module DM. For example, the window member WM may include a glass substrate, a sapphire substrate, or a plastic film. The window member WM may have a multilayer or single layer structure. By way of example, the window member WM may have a laminated structure featuring a plurality of plastic films bonded by an adhesive. The window member WM may also have a laminated structure of a glass substrate and a plastic film bonded by an adhesive.

In this exemplary embodiment, the display device DD may further include a plurality of adhesive members AD1 and AD2. A first adhesive member AD1 may be disposed between the input sensing layer TSL and the anti-reflection layer LRL, and bonds the input sensing layer TSL and the anti-reflection layer LRL. A second adhesive member AD2 may be disposed between the anti-reflection layer LRL and the window member WM, and bonds the anti-reflection layer LRL and the window member WM.

In other exemplary embodiments of the present inventive concepts, at least one of the input sensing layer TSL, the anti-reflection layer LRL, or the window member WM may be omitted.

Figure 3:
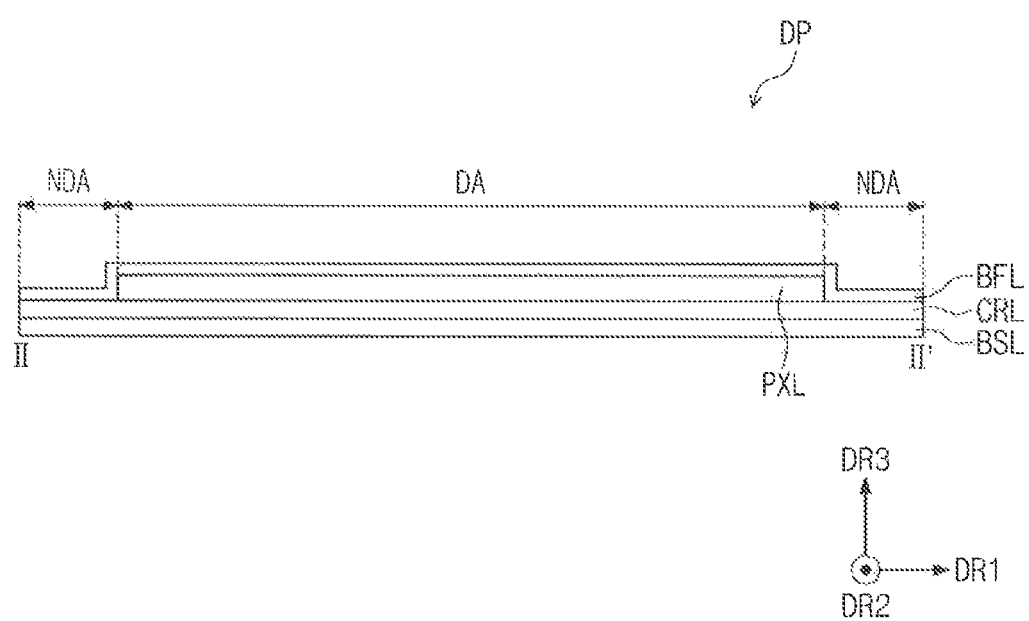
FIG. 3 is a cross-sectional view of the display panel illustrated in FIG. 1 taken along line II-II' according to an exemplary embodiment of the present inventive concepts.
Figure 4:
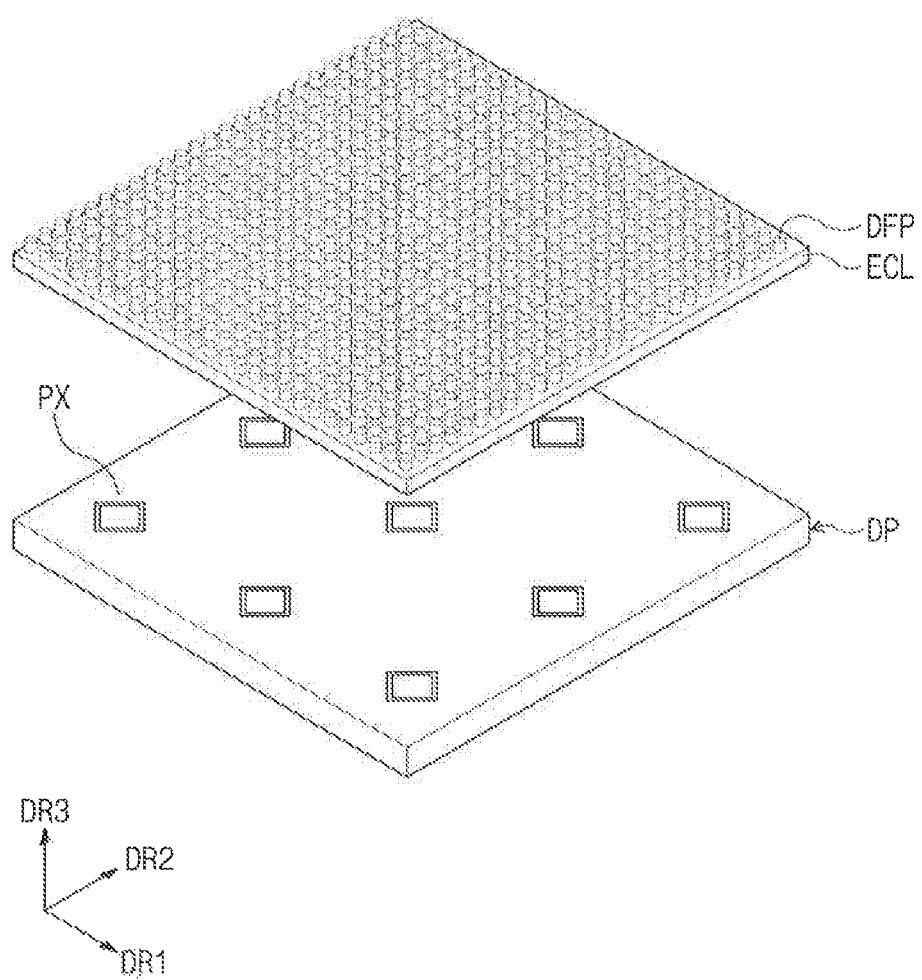
FIG. 4 is an exploded perspective view of a display module illustrated in FIG. 1 according to an exemplary embodiment of the present inventive concepts.

FIG. 3 is a cross-sectional view of the display panel illustrated in FIG. 1 taken along line II-II'. FIG. 4 is an exploded perspective view of the display module illustrated in FIG. 1.

For convenience of description, illustrated in FIG. 4 is an exploded perspective view of a portion, corresponding to a display region DA illustrated in FIG. 1, of the display panel DP, the encapsulation layer ECL, and the diffraction patterns DFP.

The display panel DP may include a plurality of display elements configured to display an image IMG on the display panel DP. Referring to FIGS. 3 and 4, the display panel DP according to an exemplary embodiment of the present inventive concepts may be an organic light emitting display panel. Each of the display elements included in the display panel DP according to this embodiment may be an organic light emitting element OLED. However, the display elements are not limited thereto and may be one of various light emitting elements including, but not limited to, LCD, LED, micro-LED, nano-LED, and a light emitting element having quantum dots or quantum rods.

Specifically, as shown in FIG. 3, the display panel DP may include a base layer BSL, a circuit layer CRL, a pixel layer PXL, and a buffer layer BFL. The base layer BSL may define a rear surface of the display panel DP. The circuit layer CRL may be disposed on the base layer BSL. The circuit layer CRL may include a plurality of thin film transistors and a plurality of signal lines for driving a light emitting element (e.g., OLED of FIGS. 5 and 6).

The pixel layer PXL may be disposed on the circuit layer CRL. The pixel layer PXL may include the plurality of display elements and a pixel defining film for partitioning the display elements. At least one display element of the pixel layer PXL, and at least one thin film transistor of the circuit layer CRL connected to the at least one display element may define one pixel PX. Accordingly, the display panel DP according to this exemplary embodiment includes a plurality of pixels PX.

According to an exemplary embodiment of the present inventive concepts, the type of the display panel DP may be determined depending on the configuration of the pixel layer PXL. The display panel DP may be an organic light emitting display panel, a liquid crystal display panel, an electrophoretic display panel, an electrowetting display panel, or any one of various display panels capable of displaying an image. In addition, the display panel DP according to an exemplary embodiment of the present inventive concepts may include various embodiments and is not limited to any one exemplary embodiment. In the following figures, a case that the display panel DP is an organic light emitting display panel is described as an example.

The buffer layer BFL may be disposed on the pixel layer PXL to cover the pixel layer PXL. A material of the buffer layer BFL is not particularly limited. For example, the buffer layer BFL may include an inorganic material or an organic material. Alternatively, the buffer layer BFL may be in the form of a single layer structure or a laminated structure of at least one of an organic layer or an inorganic layer. In another exemplary embodiment, a buffer layer BFL may also be an air layer. The buffer layer BFL may be a planarization layer that planarizes a top surface of the pixel layer PXL. The buffer layer BFL according to an exemplary embodiment of the present inventive concepts may be provided in various forms and is not limited to any one exemplary embodiment. In an exemplary embodiment, the buffer layer BFL may also be omitted.

Referring to FIG. 4, the display module DM may include an encapsulation layer ECL disposed on the display panel DP, and the plurality of diffraction patterns DFP.

The encapsulation layer ECL may be disposed on the display panel DP to cover the display panel DP. The encapsulation layer ECL may cover the plurality of pixels PX. The encapsulation layer ECL may be disposed between the plurality of pixels PX and the plurality of diffraction patterns DFP. The encapsulation layer ECL may cover the plurality of pixels PX to protect the plurality of pixels PX from the permeation of external oxygen, impurities, moisture and the like.

The encapsulation layer ECL may be a transparent insulating substrate in an exemplary embodiment. The encapsulation layer ECL may be a glass substrate, a quartz substrate, a transparent resin substrate, or the like. A sealing member may be disposed between the encapsulation layer ECL and the display panel DP to bond the encapsulation layer ECL and the display panel DP together.

Alternatively, the encapsulation layer ECL may be in the form of a single layer structure or a laminated structure of at least one of an organic layer or an inorganic layer. The encapsulation layer ECL may be in the form of an alternate lamination of an inorganic layer and an organic layer. In this exemplary embodiment, the inorganic layer may block external oxygen and moisture, and the organic layer may planarize a step generated by the pixel defining film or the like. In this exemplary embodiment, an inorganic layer may be disposed at the top of the encapsulation layer ECL.

The plurality of diffraction patterns DFP may be disposed on the encapsulation layer ECL. In the exemplary embodiment shown in FIG. 4, the diffraction patterns DFP may be disposed directly on the encapsulation layer ECL. For example, the diffraction patterns DFP may be arranged in a matrix form on a top surface of the encapsulation layer ECL. The diffraction patterns DFP diffract at least a portion of incident light. The diffraction patterns DFP will be described later in more detail with reference to FIGS. 7A to 15.

Figure 5:
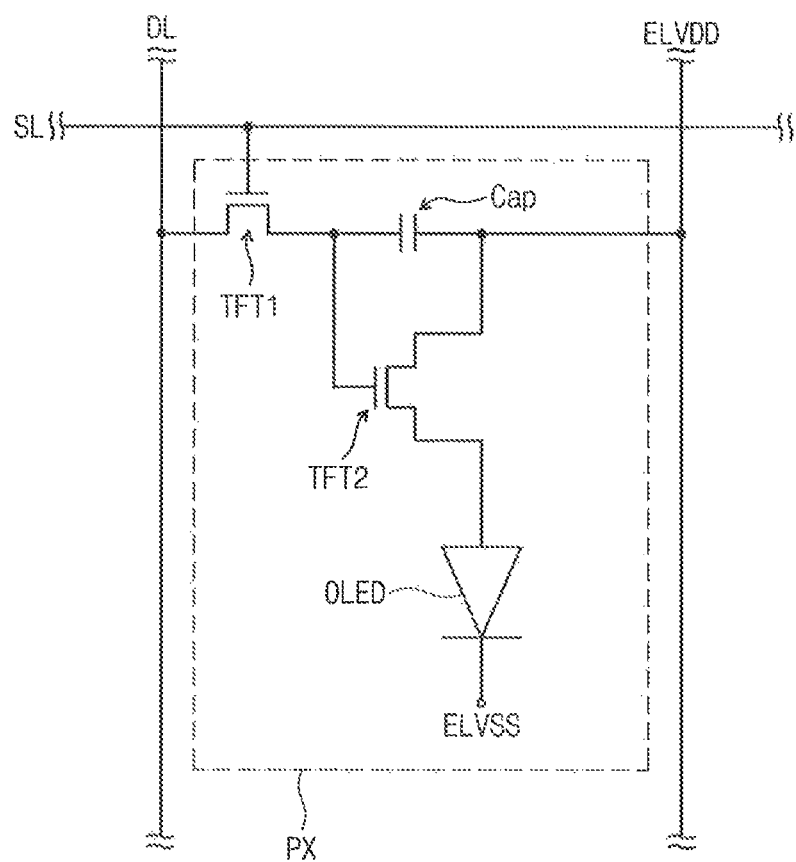
FIG. 5 is an equivalent circuit diagram of one pixel illustrated in FIG. 4 according to an exemplary embodiment of the present inventive concepts.

FIG. 5 is an equivalent circuit diagram of one pixel illustrated in FIG. 4. In FIG. 5, an exemplary embodiment in which the display element is an organic light emitting element OLED is described.

Referring to FIG. 5, the pixel PX may include at least one thin film transistor, at least one capacitor, and at least one display element. In the exemplary embodiment shown in FIG. 5, the pixel PX includes a first thin film transistor TFT1, a second thin film transistor TFT2, a capacitor Cap, and the organic light emitting element OLED.

The first thin film transistor TFT1 may include a control electrode connected to a scan line SL, an input electrode connected to a data line DL, and an output electrode. The first thin film transistor TFT1 may output a data signal applied to the data line DL in response to a scan signal applied to the scan line SL.

The capacitor Cap may include a first capacitor electrode connected to the first thin film transistor TFT1, and a second capacitor electrode receiving a first power supply voltage ELVDD. The capacitor Cap may be charged with a voltage or quantity of electric charge corresponding to a difference between the voltage corresponding to the data signal received from the first thin film transistor TFT1 and the first power supply voltage ELVDD.

The second thin film transistor TFT2 may include a control electrode connected to the output electrode of the first thin film transistor TFT1 and the first capacitor Cap, an input electrode receiving the first power supply voltage ELVDD, and an output electrode. The output electrode of the second thin film transistor TFT2 may be connected to the organic light emitting element OLED.

The second thin film transistor TFT2 controls a driving current flowing into the organic light emitting element OLED in response to the quantity of electric charge stored in the capacitor Cap. Turn-on time of the second thin film transistor TFT2 may be determined depending on the quantity of electric charge which has been charged in the capacitor Cap. The output electrode of the second thin film transistor TFT2 may provide the organic light emitting element OLED with a voltage that is lower than the first power supply voltage ELVDD.

The organic light emitting element OLED may include a first electrode connected to the second thin film transistor TFT2 and a second electrode receiving a second power supply voltage ELVSS. The organic light emitting element OLED may include a light emitting pattern disposed between the first electrode and the second electrode.

The organic light emitting element OLED emits light during a turn-on period of the second thin film transistor TFT2. The color of light generated in the organic light emitting element OLED may be determined by a material constituting the light emitting pattern. For example, the color of light generated in the organic light emitting element OLED may be one of a red color, a green color, a blue color, and a white color. The organic light emitting element OLED substantially defines a light emitting region PXA (see FIG. 6) on the display panel DP.

Figure 6:
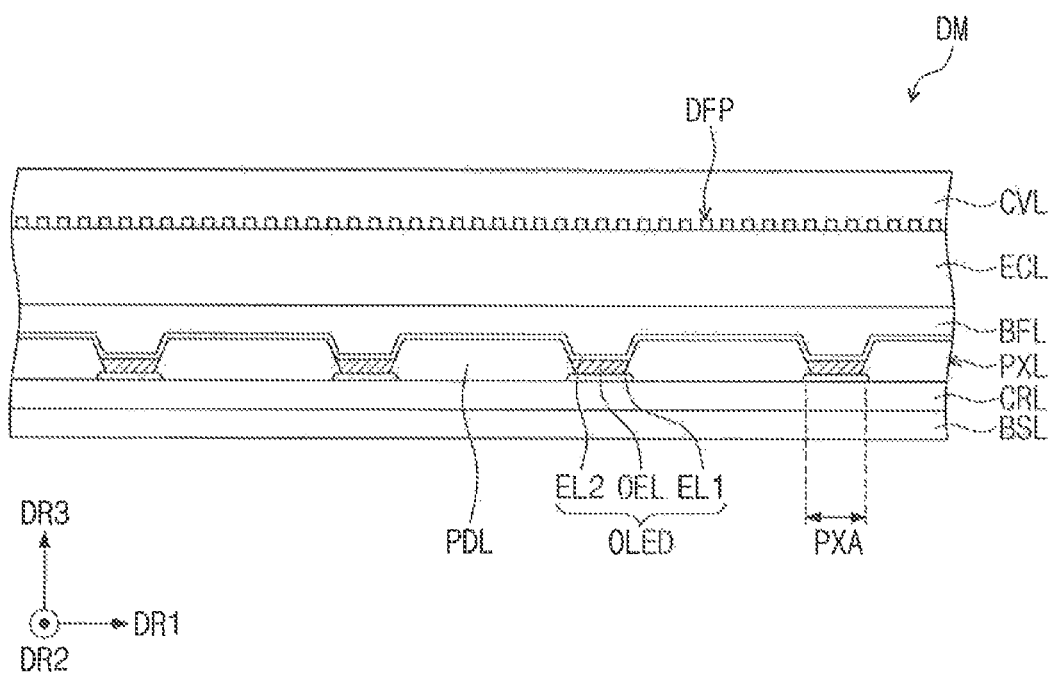
FIG. 6 is a cross-sectional view of the display module illustrated in FIG. 4 according to an exemplary embodiment of the present inventive concepts.

FIG. 6 is a cross-sectional view of the display module illustrated in FIG. 4.

Referring to FIG. 6, the pixel layer PXL may include organic light emitting elements OLED and a pixel defining film PDL as described above.

Each of the organic light emitting elements OLED may include a first electrode EL1, a second electrode EL2, and a light emitting layer OEL. The first electrode EL1 may be a pixel electrode or an anode. The first electrode EL1 may be a transflective or reflective electrode. In an exemplary embodiment, the first electrode EL1 may include Ag, Mg, Al, Pt, Pd, Au, Ni, Nd, Ir, Cr or a mixture thereof. Alternatively, the first electrode EL1 may be a structure of a plurality of layers including a reflective film or a transflective film formed of the above materials, and a transparent conductive film formed of indium tin oxide (ITO), indium zinc oxide (IZO), zinc oxide (ZnO), indium tin zine oxide (ITZO), or the like.

The second electrode EL2 may be a common electrode or a cathode. The second electrode EL2 may be a transmissive electrode. In an exemplary embodiment, the second electrode EL2 may include Li, Ca, LiF/Ca, LiF/Al, Al, Mg, BaF, Ba, Ag metals, or a compound or mixture thereof (for example, a compound of Ag and Mg). However, the second electrode EL2 is not limited thereto, and may also include, for example, indium tin oxide (ITO), indium zinc oxide (IZO), zinc oxide (ZnO), or indium tin zinc oxide (ITZO).

The pixel defining film PDL may be disposed on the first electrode EL1. The pixel defining film PDL may cover a portion of the first electrode EL1, and expose another portion thereof. A portion of the first electrode EL1 may be exposed by an opening defined in the pixel defining film PDL, and a region in which the opening is defined may correspond to a pixel region. The region that is covered by the pixel defining film PDL may be a non-light emitting region.

The light emitting layer OEL may be disposed between the first electrode EL1 and the second electrode EL2. The light emitting layer OEL may be disposed in the light emitting region PXA defined by the pixel defining film PDL.

In an exemplary embodiment, a plurality of common layers in addition to the light emitting layer OEL may further be disposed between the first electrode EL1 and the second electrode EL2. For example, a hole injection layer, a hole transport layer, the light emitting layer, an electron transport layer, and an electron injection layer may be sequentially laminated between the first electrode ELL and the second electrode EL2. Additionally, at least one of a hole blocking layer, a hole buffer layer, or an electron blocking layer may further be disposed between the first electrode EL1 and the second electrode EL2.

The organic light emitting elements OLED may be spaced apart and arranged at predetermined intervals in the first direction DR1. The organic light emitting elements OLED may also be arranged at similar or identical intervals in the second direction DR2 crossing the first direction DR1. The plurality of diffraction patterns DFP may be arranged at constant intervals in the first direction DR1. In an exemplary embodiment, the length of each diffraction pattern DFP in the first direction DR1 is smaller than the length of the organic light emitting element OLED. The diffraction patterns DFP may be spaced apart at intervals that are less than each of the intervals between the organic light emitting elements OLED.

Figure 7A:
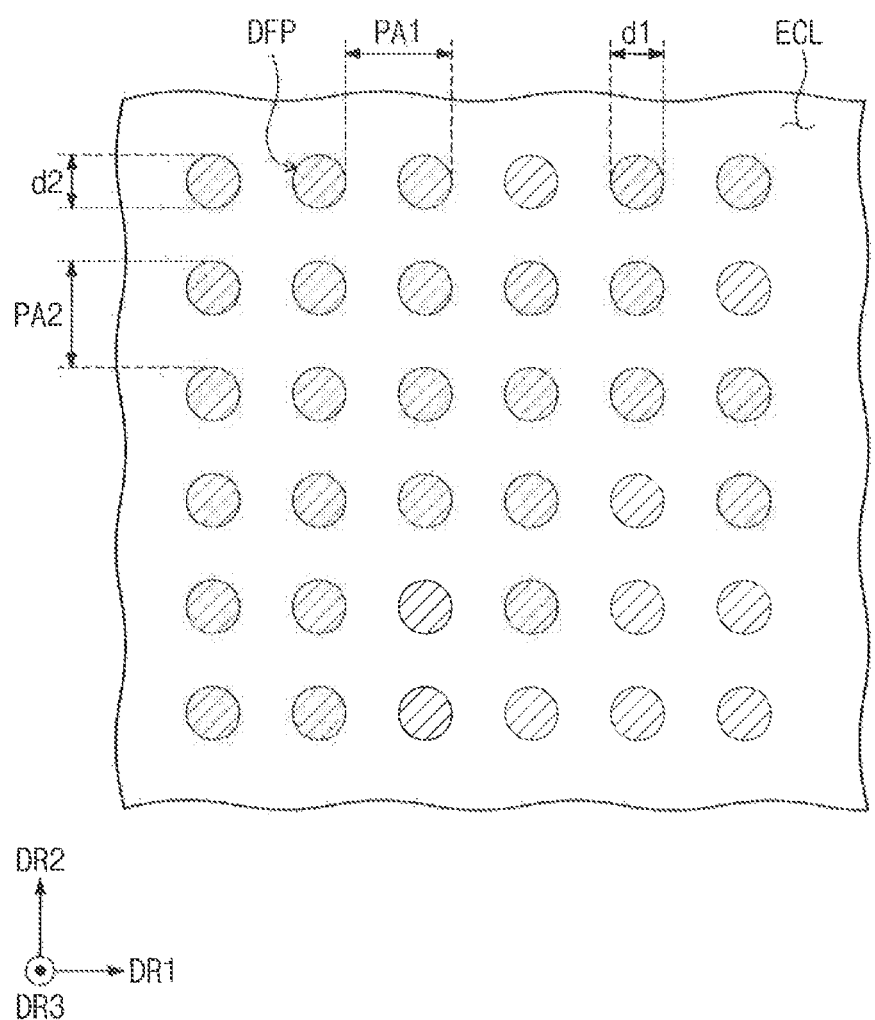
FIG. 7A is a plan view of diffraction patterns according to an exemplary embodiment of the present inventive concepts.
Figure 7B:
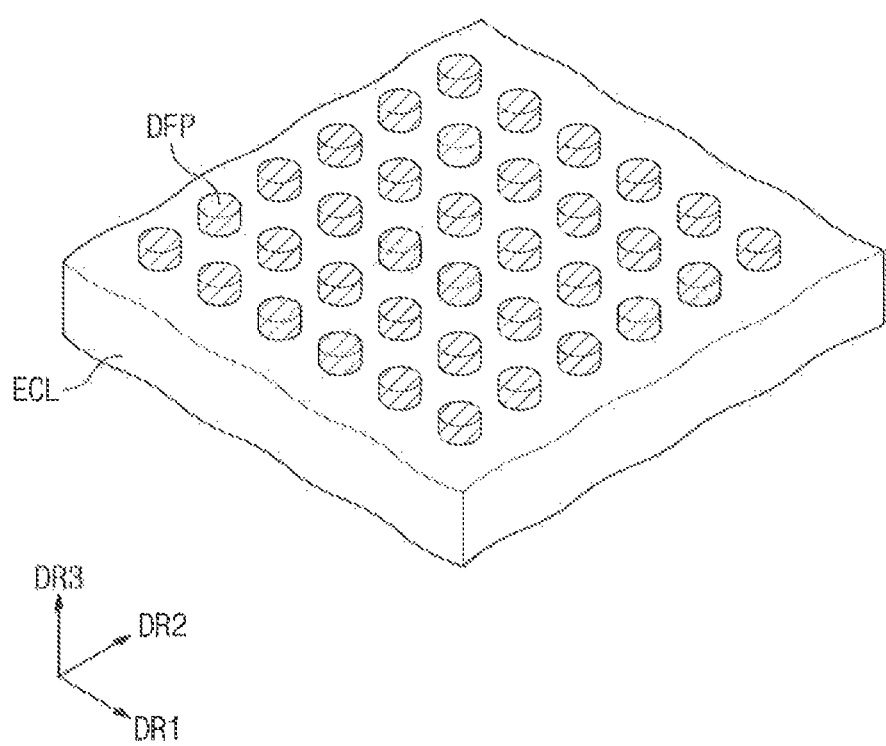
FIG. 7B is a perspective view of the diffraction patterns according to an exemplary embodiment of the present inventive concepts.

FIG. 7A is a plan view of diffraction patterns according to an exemplary embodiment of the present inventive concepts. FIG. 7B is a perspective view of the diffraction patterns according to an exemplary embodiment of the present inventive concept.

Referring to FIGS. 7A and 7B, the diffraction patterns DFP may be arranged on the encapsulation layer ECL. In an exemplary embodiment, each of the diffraction patterns DFP may have a cylindrical shape when viewed above from the third direction DR3. For example, each of the diffraction patterns DFP may have a circular shape in a plane defined by the first direction DR1 and the second direction DR2. In an exemplary embodiment, diameters d1 and d2 of each of the diffraction patterns DFP may be about 2.5 um to about 5.0 um. The diffraction patterns DFP in adjacent rows may overlap each other in the second direction DR2 and diffraction patterns DFP in adjacent columns may overlap each other in the first direction DR1. However, exemplary embodiments of the present inventive concepts are not limited to particular shapes and sizes of each of the diffraction patterns DFP.

The diffraction patterns DFP may be arranged to have a matrix form having a plurality of rows and columns in the first direction DR1 and the second direction DR2. For example, the diffraction patterns DFP may have rows arranged in the second direction DR2 and extending in the first direction DR1. The diffraction patterns DFP may have columns arranged in the first direction DR1 and extending the second direction DR2. The diffraction patterns DFP may be arranged to have constant intervals PA1 and PA2 in the first direction DR1 and the second direction DR2 respectively. Specifically, the diffraction patterns DFP may have a first interval PA1 in the first direction DR1, and a second interval PA2 in the second direction DR2. In the exemplary embodiment shown in FIG. 7A, the first interval PA1 and the second interval PA2 are approximately the same. In an exemplary embodiment, each of the first interval PA1 and the second interval PA2 may be about 4.5 um to about 7.5 um inclusive.

The diffraction patterns DFP according to an exemplary embodiment of the present inventive concepts diffract at least a portion of incident light traveling from the buffer layer BFL towards the display surface IS. In this embodiment, the first interval PA1 and the second interval PA2 may be designed differently depending on the wavelength λ of light the diffraction patterns DFP may diffract. In an exemplary embodiment, each of the first interval PA1 and the second interval PA2 may be about λ/n*sin θ. n is a difference between the refractive index of the diffraction patterns DFP and the refractive index of the cover layer CVL (see FIG. 2), and θ is an angle formed by the third direction DR3 and light incident from the buffer layer BFL on the diffraction patterns DFP. In another exemplary embodiment of the inventive concept, the distance of the first interval PA1 and the second interval PA2 may be different from each other.

In an exemplary embodiment of the present inventive concepts, the diffraction patterns DFP may include an organic material. An organic material included in the diffraction patterns DFP is not particularly limited. The organic material may diffract at least a portion of incident light, and may be selected depending on the wavelength of light to be diffracted. In an exemplary embodiment, the diffraction patterns DFP may be an organic material including silicon (Si). In an exemplary embodiment, the diffraction patterns DFP may include an acrylic or siloxane material. An organic material included in the diffraction patterns DFP may be selected from materials for diffracting light generated in the organic light emitting element OLED (see FIG. 6). In an exemplary embodiment described later, the diffraction patterns DFP may be formed through a photolithography process by the inclusion of a photosensitive material in the organic material.

Figure 8A:
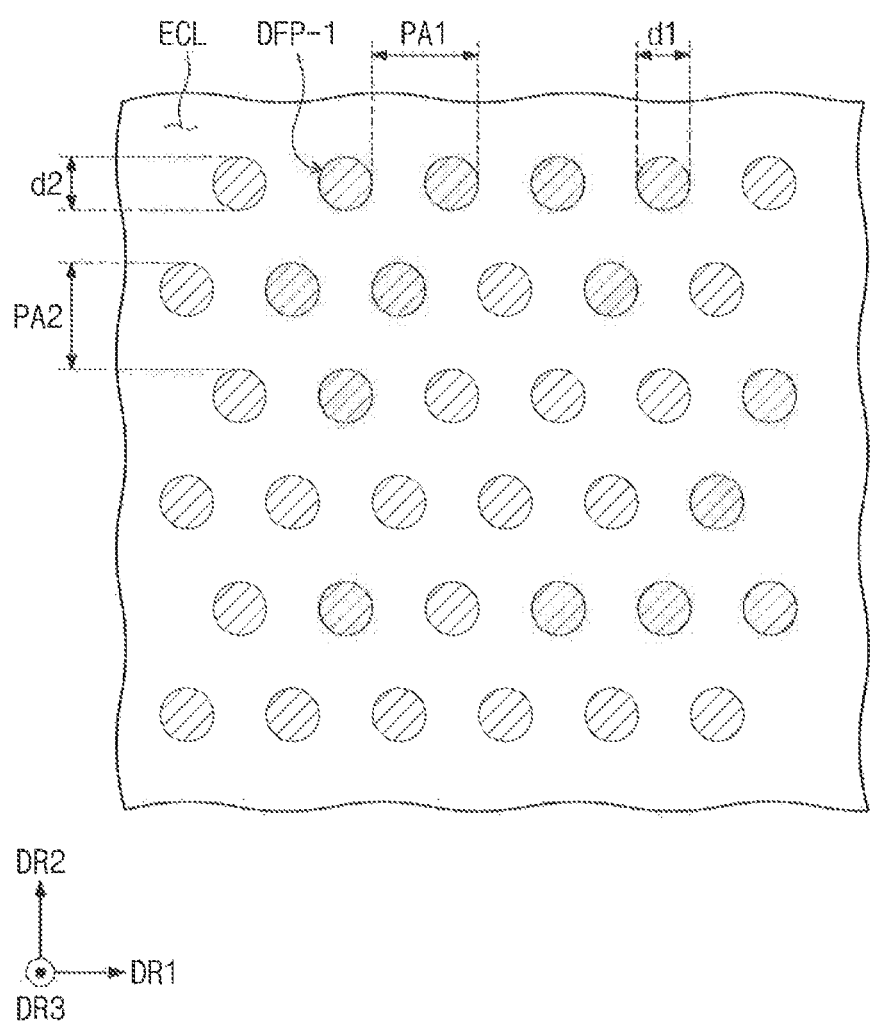
FIG. 8A is a plan view of diffraction patterns according to an exemplary embodiment of the present inventive concepts.
Figure 8B:
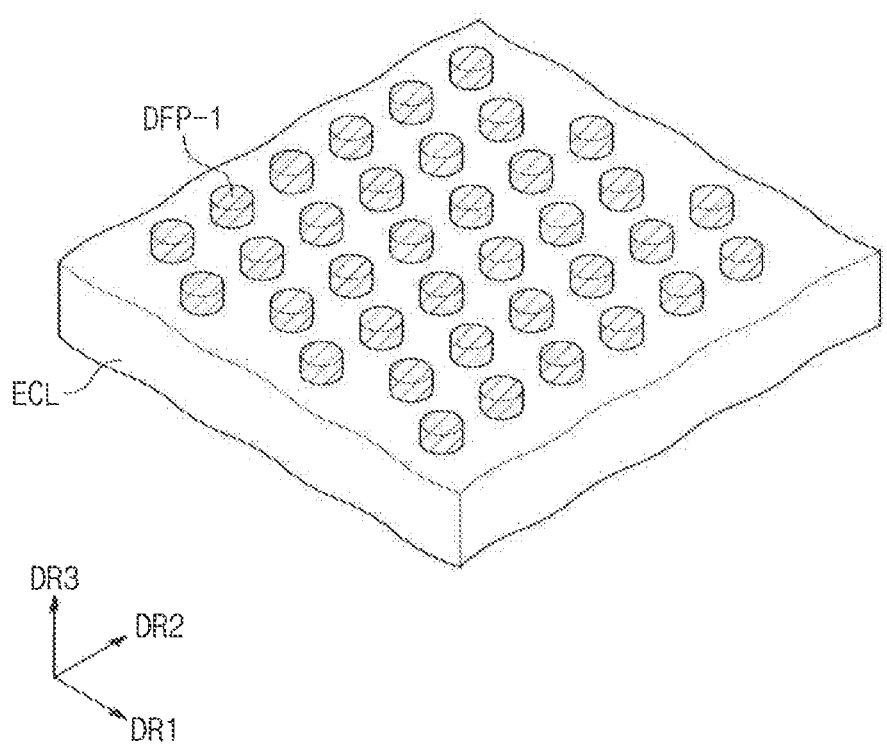
FIG. 8B is a perspective view of the diffraction patterns according to an exemplary embodiment of the present inventive concepts.

FIG. 8A is a plan view of diffraction patterns according to another exemplary embodiment of the present inventive concepts. FIG. 8B is a perspective view of the diffraction patterns according to another exemplary embodiment of the present inventive concepts.

Referring to FIGS. 8A and 8B, diffraction patterns DFP-1 may be arranged to have constant intervals PA1 and PA2 in a first direction DR1 and a second direction DR2, respectively. The diffraction patterns DFP-1 may be arranged side by side so as to have the constant interval PA1 in the first direction DR1, and alternately arranged in the second direction DR2. More specifically, each of the diffraction patterns DFP-1 next to each other in the first direction DR1 may overlap each other in the first direction DR1, and each of the diffraction patterns DFP-1 next to each other in the second direction DR2 may not overlap each other in the second direction DR2. For example, the diffraction patterns DFP-1 in alternating rows may be offset from each other in the first direction DR. In the exemplary embodiment shown in FIG. 8A, the diffraction patterns DFP-1 in even rows (e.g., the second row, fourth row and sixth row) are offset from the corresponding diffraction pattern DFP-1 in odd rows (e.g., the first row, third row and fifth row) in the first direction DR1 by a distance of approximately the diameter d1 of one diffraction pattern DFP-1. However, in alternative embodiments, the arrangement of the offset patterns and the distance that the patterns are offset may vary. The diffraction patterns DFP-1 may be arranged so as to be in a row in the first direction DR1, and each of the diffraction patterns DFP-1 next to each other in the second direction DR2 may be arranged so as to be next to each other in a diagonal direction.

Figure 9:
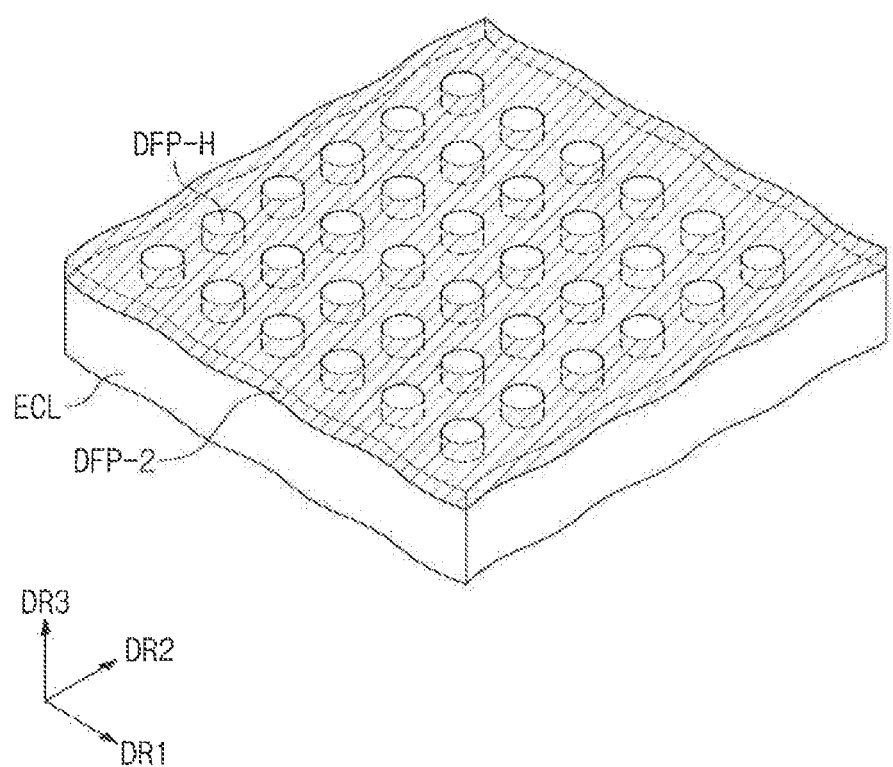
FIG. 9 is a perspective view of diffraction patterns according to an exemplary embodiment of the present inventive concepts.
Figure 10:
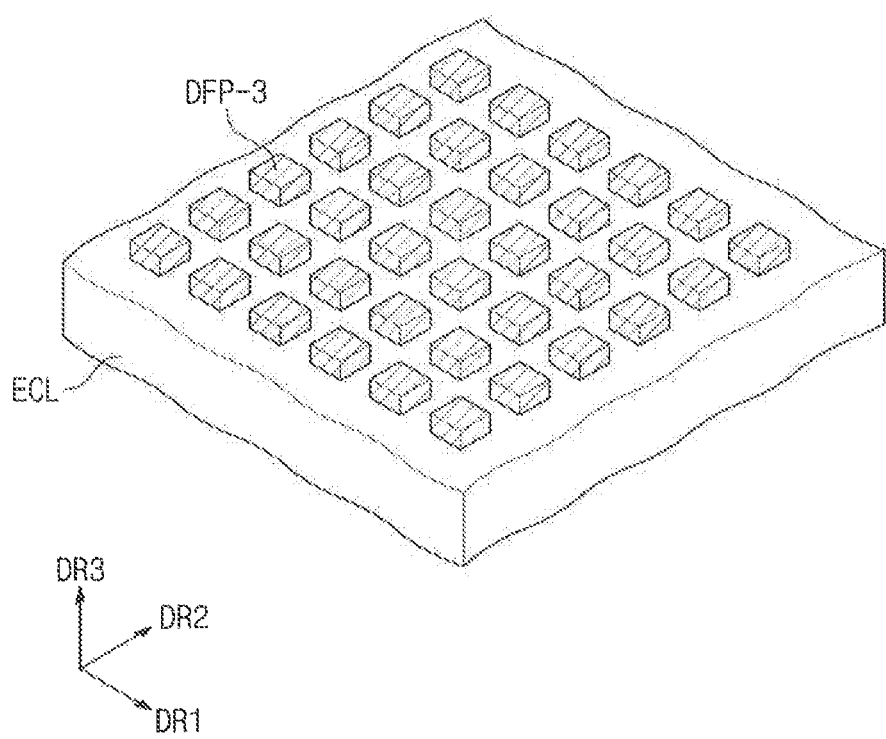
FIG. 10 is a perspective view of diffraction patterns according to an exemplary embodiment of the present inventive concepts.
Figure 11:
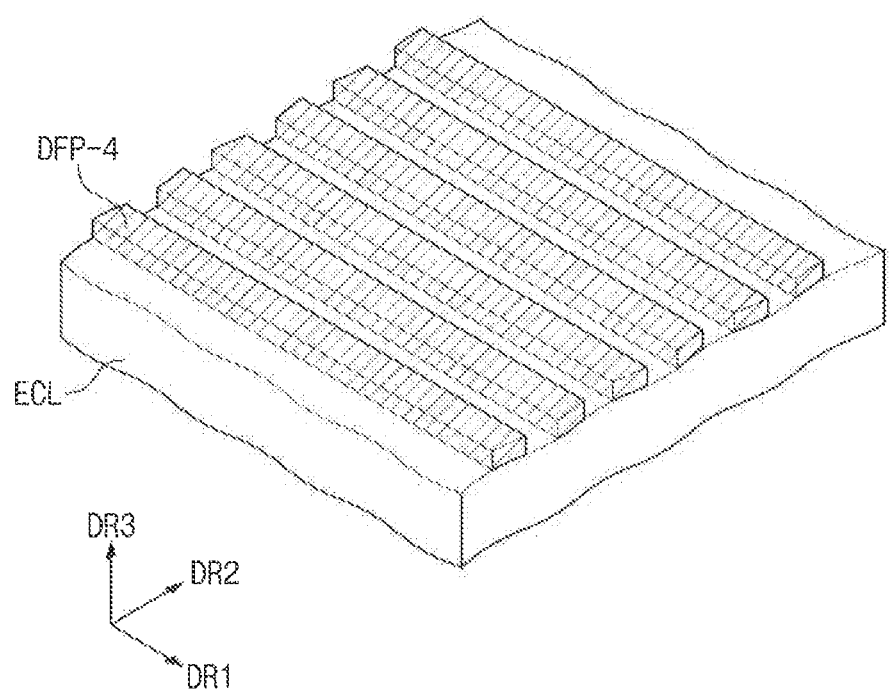
FIG. 11 is a perspective view of diffraction patterns according to an exemplary embodiment of the present inventive concepts.

FIGS. 9 to 11 are perspective views of diffraction patterns according to other exemplary embodiments of the present inventive concepts.

Referring to FIG. 9, a diffraction pattern layer DFP-2 may be disposed on an encapsulation layer ECL and have a single layer shape in which a plurality of diffraction pattern holes DFP-H having an engraved cylindrical shape are defined. The diffraction pattern holes DFP-H may be defined to penetrate the diffraction pattern layer DFP-2. While the plurality of diffraction patterns DFP and DFP-1 respectively illustrated in FIGS. 7B and 8B are in shapes protruding from the encapsulation layer ECL toward a light emitting direction (e.g., third direction DR3), the diffraction pattern holes DFP-H illustrated in FIG. 9 may be in a direction opposite to a light emitting direction, such as in the direction from the diffraction pattern layer DFP-2 to the encapsulation layer ECL.

Referring to FIG. 10, a plurality of diffraction patterns DFP-3 may have a square pillar shape. The plurality of diffraction patterns DFP-3 may have a quadrangular shape when viewed from above (e.g., from the third direction DR3). Although exemplarily illustrated in FIG. 10 to have a square pillar shape having a square shape when viewed in a plane, the plurality of diffraction patterns DFP-3 are not limited thereto, and may have a variety of square pillar shapes for diffraction of light emitted from display elements. The diffraction patterns DFP-3 in adjacent columns overlap each other. The diffraction patterns DFP-3 in adjacent rows overlap each other. However, in other exemplary embodiments, the diffraction patterns DFP-3 in adjacent columns and/or adjacent rows may be offset from each other (e.g., in the first direction DR1 or second direction DR2).

Referring to FIG. 11, a plurality of diffraction patterns DFP-4 may be arranged to have a stripe shape when viewed from above (e.g., the third direction DR3). Each of the plurality of diffraction patterns DFP-4 may each extend continuously in a first direction DR1. The diffraction patterns DFP-4 may be arranged to be spaced apart from each other in the second direction DR2. In an exemplary embodiment, the plurality of diffraction patterns DFP-4 may have a rectangular parallelepiped shape. However, in other exemplary embodiments, the diffraction patterns DFP-4 may have a different shape. When the diffraction patterns DFP-4 extend in the first direction DR1 and are spaced apart in the second direction DR2 perpendicular to the first direction DR1 as in FIG. 11, duplicate images generated by the diffraction patterns DFP-4 may be arranged only in the second direction DR2. In an alternative embodiment, the diffraction patterns DFP-4 may be arranged in stripes extending continuously in the second direction DR2 and are spaced apart in the first direction DR1. In other embodiments, the diffraction patterns DFP-4 may be arranged in a strip shape that extends in a diagonal direction not along the first direction DR1 or second direction DR2.

Figure 12:
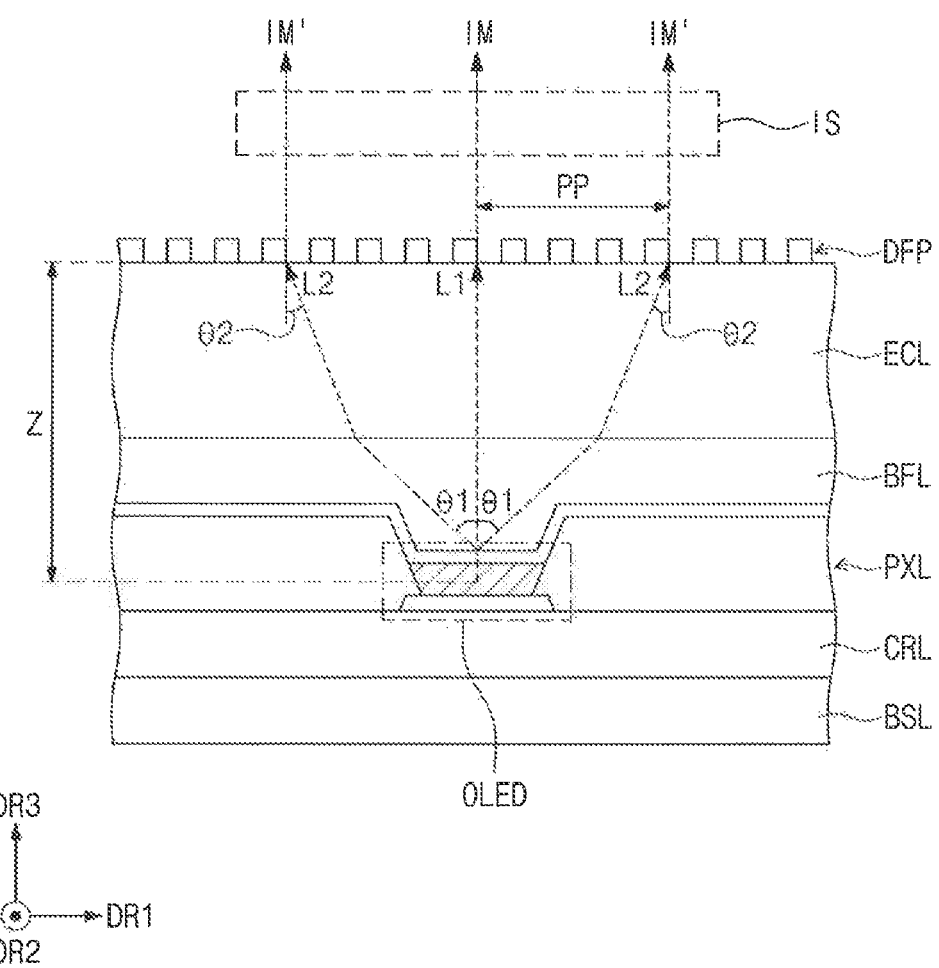
FIG. 12 is a cross-sectional view of a portion of the display module according to an exemplary embodiment of the present inventive concepts.
Figure 13:
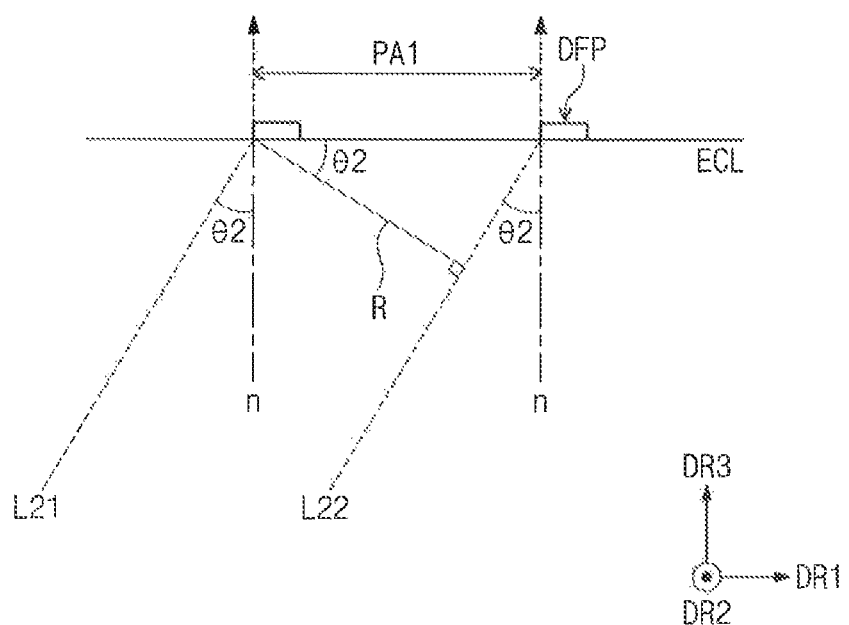
FIG. 13 is a cross-sectional view schematically illustrating a path along which light travels in the display module according to an exemplary embodiment of the present inventive concepts.

FIG. 12 is a cross-sectional view of a portion of the display module according to an exemplary embodiment of the present inventive concepts. FIG. 13 is a cross-sectional view schematically illustrating a path along which light travels in the display module according to an exemplary embodiment of the present inventive concepts. FIG. 12 schematically illustrates optical paths of light beams generated from the display element (e.g., an organic light emitting element OLED) according to an exemplary embodiment of the present inventive concepts, and FIG. 13 schematically illustrates diffraction of a second light beam illustrated in FIG. 12. FIGS. 12 and 13 illustrate only one cross section of the display module DM taken along a line parallel to the first direction DR1 for convenience of description, but the display module DM according to an exemplary embodiment of the present inventive concepts to be described later may also have a configuration the same as that of a cross section of the display module DM taken along a line parallel to the second direction DR2.

Referring to FIGS. 12 and 13, the display element (e.g., the organic light emitting element OLED) according to an exemplary embodiment of the present inventive concepts may generate light beams L1 and L2. However, the generation of light beams L1 and L2 is for convenience of description and the generation of light beams is not limited thereto. The first light beam L1 may travel upward in the third direction DR3 perpendicular to the display surface IS. The first light beam L1 may pass through the buffer layer BFL, the encapsulation layer ECL, and the diffraction patterns DFP without being diffracted by the diffraction patterns DFP. The first light beam L1 may display each of pixel unit images IM on the display surface IS.

Light beams other than the first light beam L1 generated from the display element may be defined as side light beams. For convenience of description, the side beams illustrated in FIG. 12 are solely second light beams L2. The second light beams L2 may form a first angle θ1 with the first light beam L1.

The second light beams L2 may pass through the buffer layer BFL in the direction forming the first angle θ1 with the first light beam L1. The second light beams L2 may be refracted first at an interface between the buffer layer BFL and the encapsulation layer ECL by a difference in refractive index between the buffer layer BFL and the encapsulation layer ECL. The second light beams L2 refracted first at the interface between the buffer layer BFL and the encapsulation layer ECL may form a second angle θ2 with respect to a normal direction of the interface (e.g., the third direction DR3). In an exemplary embodiment, the second angle θ2 may be smaller than the first angle θ1.

The second light beams L2 refracted at the second angle θ2 may be incident on the encapsulation layer ECL. The second light beams L2 may pass through the encapsulation layer ECL to be incident on the diffraction patterns DFP. The incident second light beams L2 may be diffracted by the diffraction patterns DFP.

According to an exemplary embodiment of the present inventive concepts, the diffraction patterns DFP having the constant interval PA1 (see FIG. 7A) may diffract the light beams L2, among incident light beams, incident at the specific angle θ2 formed with the first light beam L1 to display duplicate unit images IM' on the display surface IS. The second light beams L2 may be incident on the diffraction patterns DFP with the specific angle θ2 for displaying the duplicate unit images IM'.

According to this exemplary embodiment, the second light beams L2 emitted from the display element with the first angle 91 formed with the first light beam L1 may be transmitted and refracted by the intermediate members BFL and ECL to be incident on the diffraction patterns DFP with the second angle θ2.

In this exemplary embodiment, a distance from a top surface of the display element to a top surface of the encapsulation layer ECL on which the diffraction patterns DFP are arranged may be defined as an optical distance Z. In an exemplary embodiment, the optical distance Z may be about 50 um to about 300 um inclusive.

As described above, the diffraction patterns DFP may diffract the second light beams L2 to display the duplicate unit images IM' on the display surface IS.

As shown in FIG. 13, each of the second light beams L2 may include a first sub-light beam L21 and a second sub-light beam L22. The first sub-light beam L21 and the second sub-light beam L22 may be respectively incident on diffraction patterns DFP different from each other. The first sub-light beam L21 and second sub-light beam L22 may be parallel to each other and extend at a second angle θ2 formed with respect to a normal direction n of the encapsulation layer ECL (e.g., the third direction DR3). An optical path difference may occur between the first sub-light beam L21 and the second sub-light beam L22, and the optical path difference may be defined as a first distance R.

According to this embodiment, the first sub-light beam L21 and the second sub-light beam L22 may interfere constructively by being diffracted by the diffraction patterns DFP. A phase difference may occur between the first sub-light beam L21 and the second sub-light beam L22, and the phase difference may be the same as the wavelength k of the second light beam L2. Accordingly, the first distance R may be proportional to the wavelength λ of the second light beam L2. The first sub-light beam L21 and the second sub-light beam L22 that have interfered constructively may display one of the duplicate unit images IM' on the display surface IS.

Figure 14:
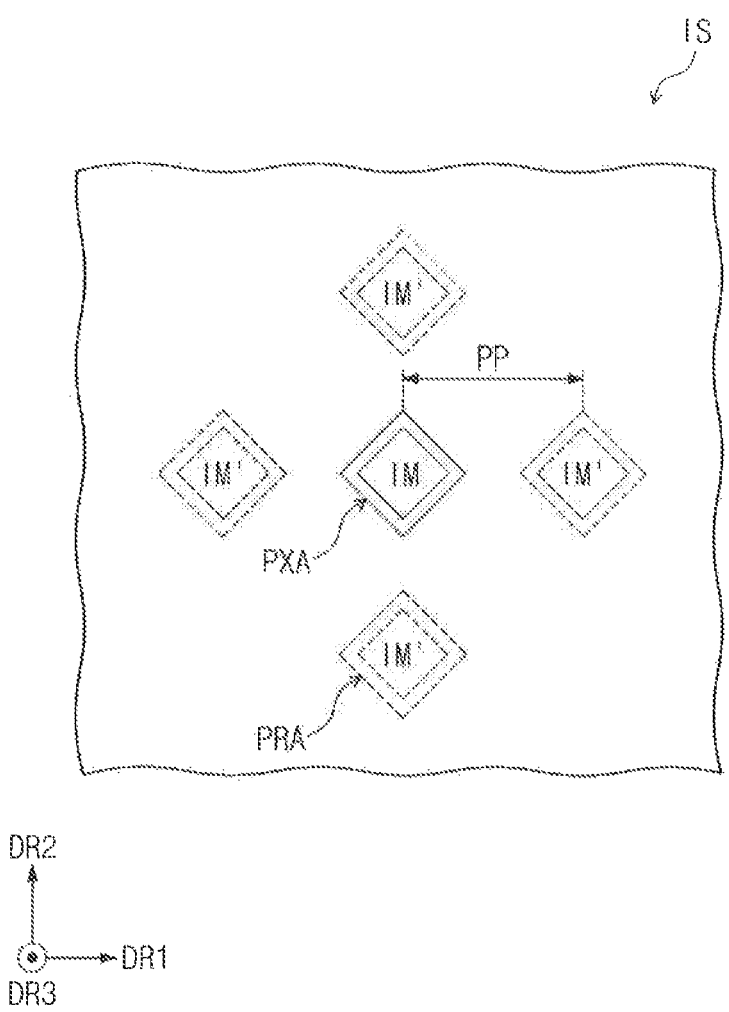
FIG. 14 is a front view of duplicate unit images formed on a display surface by diffracted light beams according to an exemplary embodiment of the present inventive concepts.

FIG. 14 is a front view of the duplicate unit images formed on the display surface by the diffracted light beams according to an exemplary embodiment. For convenience of description, only one light emitting region PXA of a plurality of light emitting regions PXA is illustrated in FIG. 14.

The display surface IS according to an exemplary embodiment of the present inventive concepts includes the plurality of light emitting regions PXA which display the pixel unit images IM and a plurality of duplicate regions PRA which display the duplicate unit images IM'. The plurality of duplicate regions PRA are arranged to surround each of the light emitting regions PXA. In this embodiment, the duplicate regions PRA may be defined on both sides of the light emitting region PXA in the first direction DR1 and on both sides of the light emitting region PXA in the second direction DR2. The shape of each of the light emitting regions PXA may be the same as the shape of each of the duplicate regions PRA. Each of the light emitting regions PXA and the duplicate regions PRA may have a rhombic shape in FIG. 14. However, exemplary embodiments of the present inventive concepts are not limited to a particular shape.

The light emitting regions PXA and the duplicate regions PRA may be arranged to be spaced apart from each other. The distance between the approximate center of the light emitting region PXA and one duplicate region PRA next to the light emitting region PXA in the first direction DR1 may be defined as a duplicate interval PP. In an exemplary embodiment, the duplicate interval PP may be about 25 um or smaller.

According to this exemplary embodiment, the first light beam L1 of light beams generated from the display element (e.g., the organic light-emitting element OLED) described above passes through the intermediate members, the buffer layer BFL and the encapsulation layer ECL, to display the pixel unit image IM in the light emitting region PXA of the display surface IS. The shape of the pixel unit image IM may correspond to a planar shape of the display element. Additionally, the second light beams L2 of light beams generated from the display element pass through the intermediate members, the buffer layer BFL and the encapsulation layer ECL, to display the duplicate unit images IM' in the duplicate regions PRA of the display surface IS. The shape of each of the duplicate unit images IM' may be the same as the shape of the pixel unit image IM. The display module DM may display an image to a user in the form of a mixture of the pixel unit images IM and the duplicate unit images IM'.

According to an exemplary embodiment of the present inventive concepts, a plurality of unit images IM and IM' may be displayed on the display surface IS by using light generated from at least one display element. In other words, each of the unit images provided from the at least one display element may be duplicated in plurality. The duplicate regions PRA in which the unit images are separately displayed may be formed in a non-light emitting region defined by the pixel defining film PDL between the light emitting regions PXA on the existing display surface IS. Therefore, a phenomenon that the non-light emitting region may be viewed from the outside may be prevented. Accordingly, the display quality of the display device DD may be improved.

Figure 15:
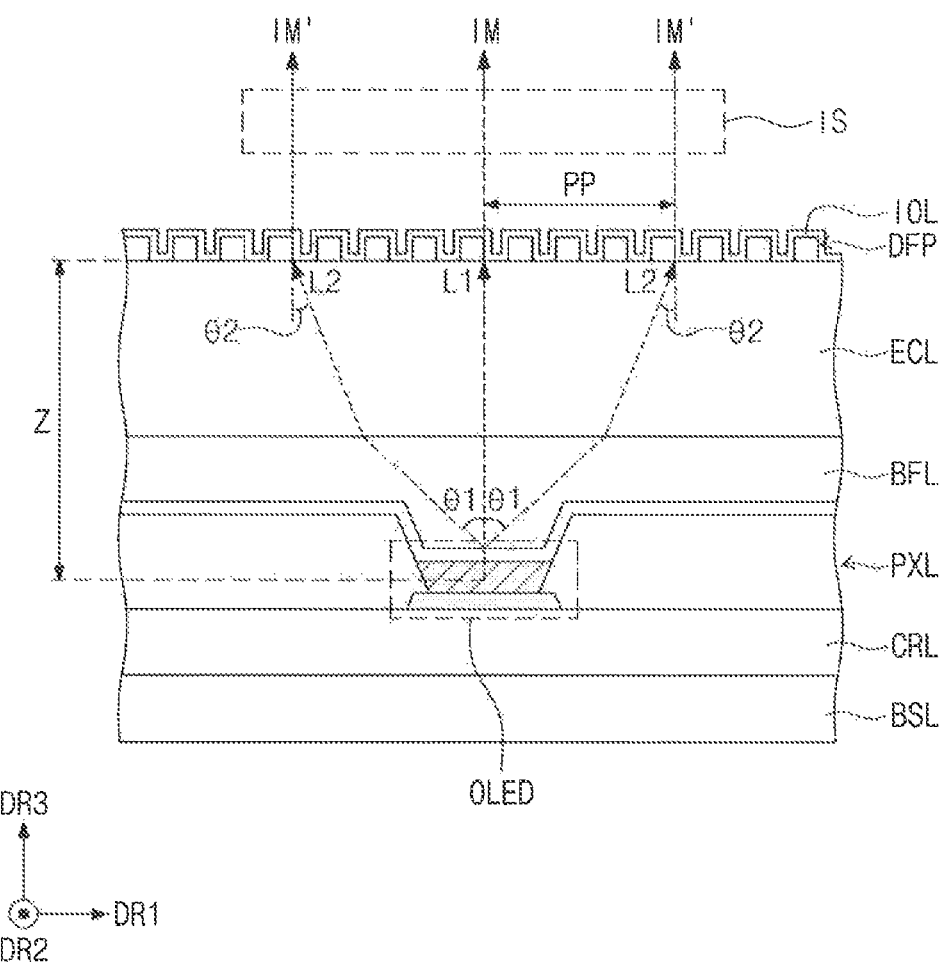
FIG. 15 is a cross-sectional view of a portion of the display module according to an exemplary embodiment of the present inventive concepts.

FIG. 15 is a cross-sectional view of a portion of the display module according to an exemplary embodiment of the present inventive concepts. When a description is given about FIG. 15, components described above with reference to FIG. 12 are denoted by the same reference numerals, and a description thereof will not be given.

Referring to FIG. 15, the display module according to an exemplary embodiment of the present inventive concepts may further include an inorganic film IOL that covers the plurality of diffraction patterns DFP. The inorganic film IOL may be disposed so as to cover top surfaces and side surfaces of the plurality of diffraction patterns DFP and contact the portions of the top surface of the encapsulation layer ECL that are exposed by gaps between the plurality of diffraction patterns DFP. The inorganic film IOL may include at least one of silicon nitride ($SiN_x$), silicon oxide ($SiO_x$), or silicon oxynitride ($SiO_xN_y$). The inorganic film IOL may prevent the plurality of diffraction patterns DFP which may include an organic material from being damaged by process conditions such as a high temperature condition that may occur in a subsequent process. When the display device DD includes the inorganic film IOL that covers the plurality of diffraction patterns DFP, the cover layer CVL (see FIG. 2) may be disposed on top of the inorganic film IOL.

Figure 16:
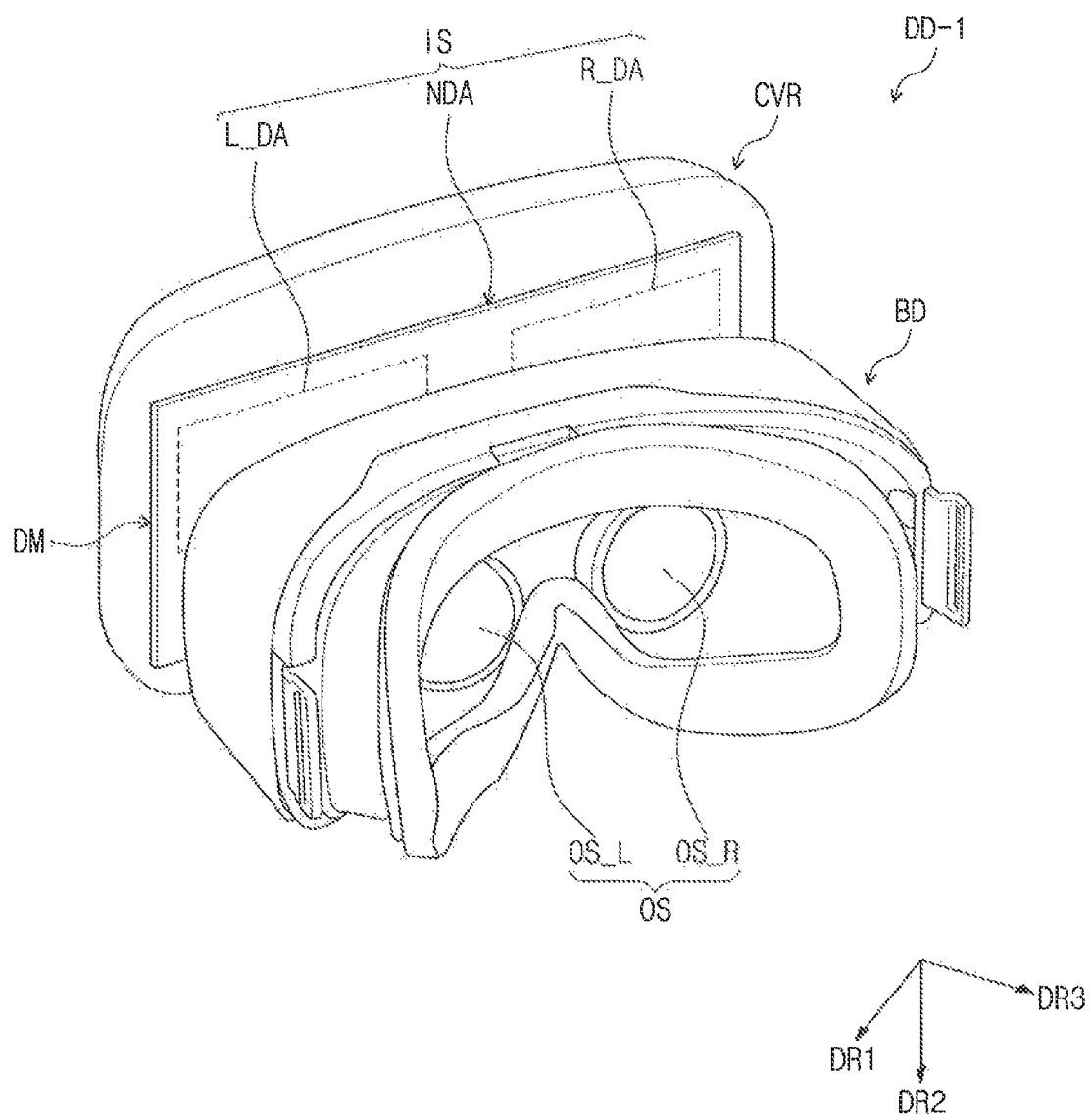
FIG. 16 is a perspective view of a display device according to another exemplary embodiment of the present inventive concepts.
Figure 17:
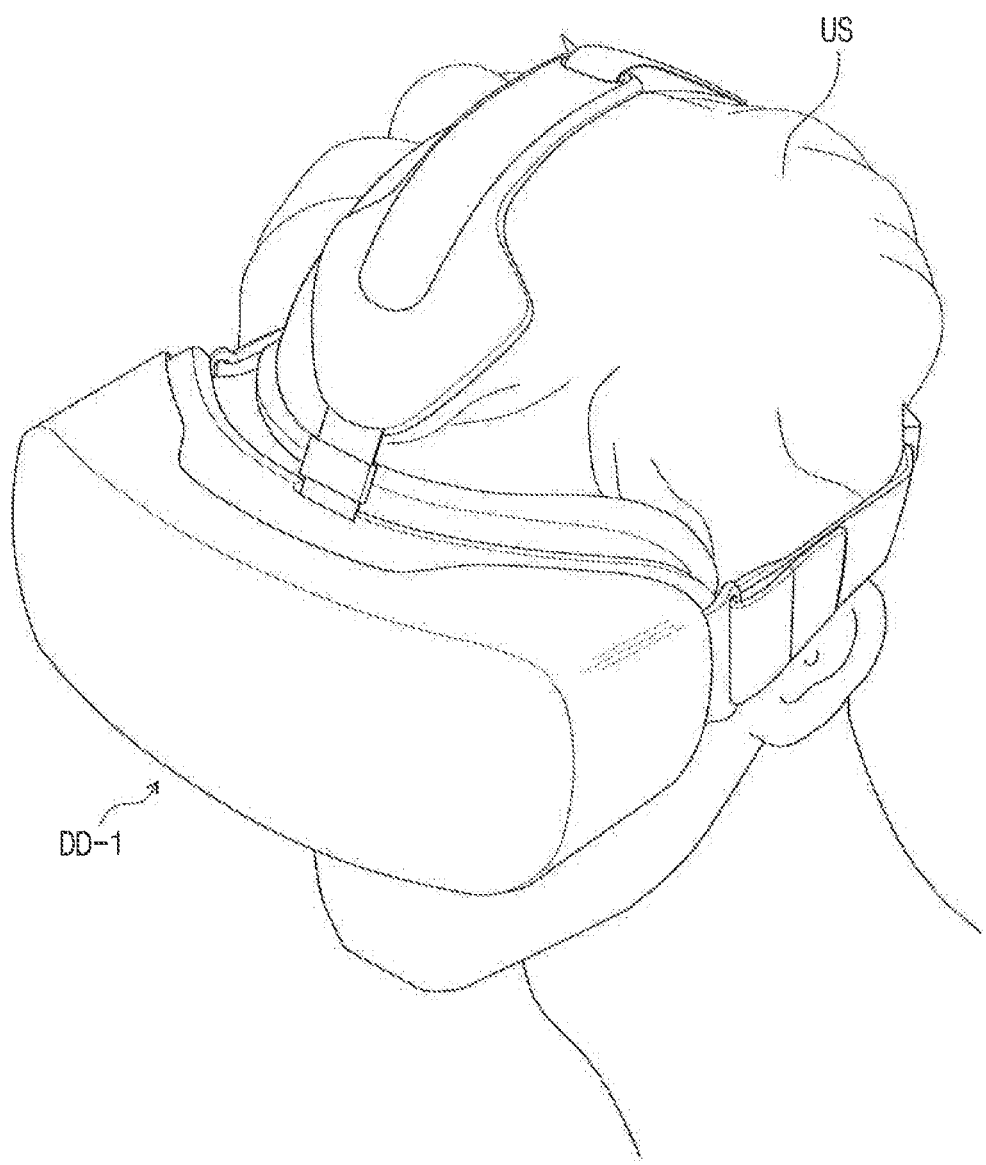
FIG. 17 is a perspective view of the display device illustrated in FIG. 16 being used by the user according to an exemplary embodiment of the present inventive concepts.
Figure 18:
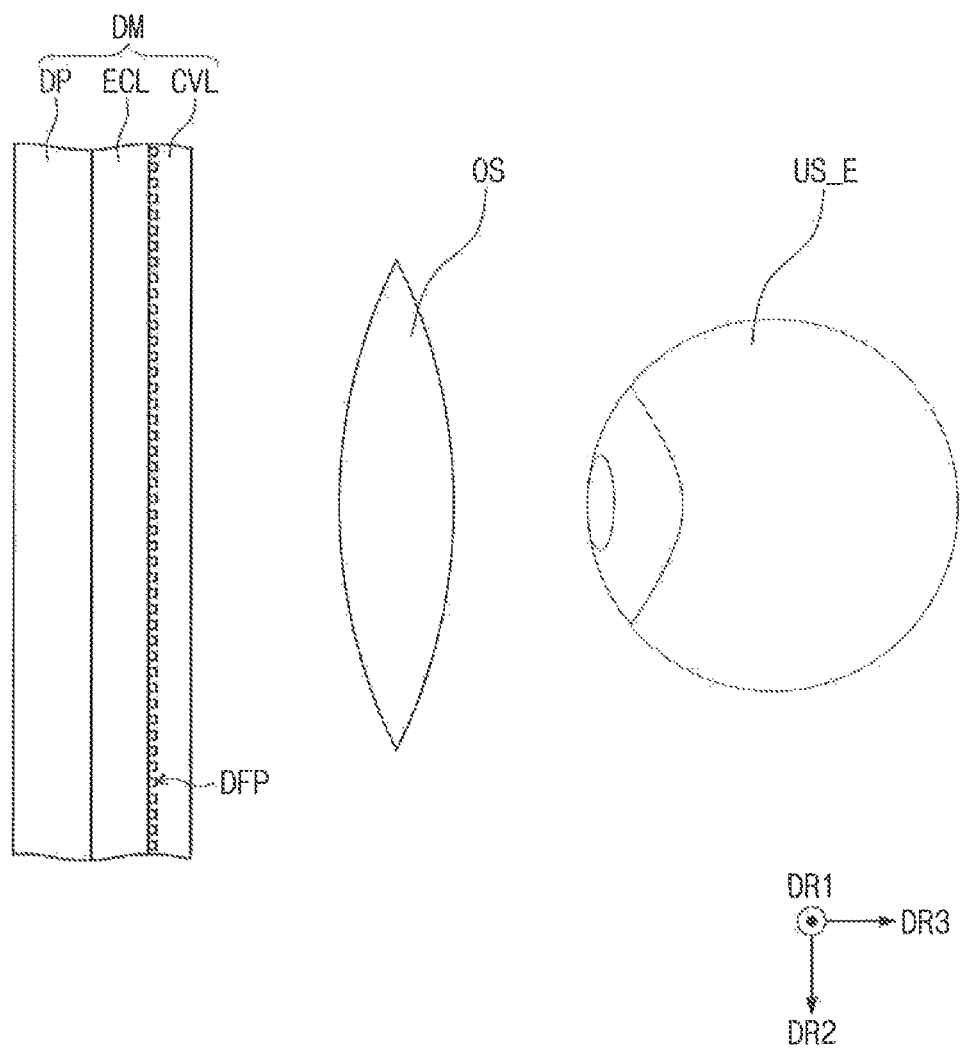
FIG. 18 is a schematic cross-sectional view of the display device illustrated in FIG. 16 according to an exemplary embodiment of the present inventive concepts.

FIG. 16 is a perspective view of a display device according to another exemplary embodiment of the inventive concepts, and FIG. 17 is a perspective view of the display device illustrated in FIG. 16 when used by a user. FIG. 18 is a schematic cross-sectional view of the display device illustrated in FIG. 16.

For convenience of description, what is different from an exemplary embodiment of the present inventive concepts described previously is mainly described, and an omitted description is in accordance with the previously described embodiment. Additionally, the components described previously are denoted by the same reference numerals, and a duplicate description of the components will not be given.

Referring to FIGS. 16 to 18, a display device DD-1 according to another exemplary embodiment of the present inventive concept may be a head mounted display (HMD). For example, the display device DD-1 according to this exemplary embodiment may be worn on the head of a user US. The display device DD-1 may display an image to the user US while blocking the user's peripheral vision. Accordingly, the display device DD-1 may provide a more immersive, virtual reality presentation for the user US wearing the display device DD-1.

The display device DD-1 according to this exemplary embodiment includes a body part BD, a cover part CVR, and a display module DM. The body part BD may be worn on the head of the user US. The body part BD may be equipped with a separate strap so that the display device DD-1 may be worn on the head of the user US. The body part BD may include an optical system OS. The body part BD may house components having various functions in addition to the optical system OS. For example, an operation unit for adjusting volume, the brightness of a screen, or the like may be additionally disposed on an outer surface the body part BD. The operation unit may be provided in the form of a physical button, a touch sensor, or the like. Further, a proximity sensor for determining whether the user US is wearing the display device DD-1 may also be housed in the body part BD.

The cover part CVR may cover the body part BD. The cover part CVR may protect the components housed in the body part BD.

The display module DM may be disposed between the cover part CVR and the body part BD. The cover part CVR may cover the display module DM, and may be combined with the body part BD. Accordingly, the display module DM may be protected by the cover part CVR and the body pan BD. The display module DM may define a display surface IS. The display surface IS may be parallel to a plane defined by a first direction DR1 and a second direction DR2. An image may be displayed in a partial region of the display surface IS. A direction in which the image may be displayed is a third direction DR3, and the third direction DR3 may be defined as a direction from the display device DD-1 to the user US when the user US wears the display device DD-1.

The display surface IS may include a right eye image display region R_DA, a left eye image display region L_DA, and a non-display region NDA.

The right eye image display region R_DA and the left eye image display region L_DA may be disposed to be spaced apart in the first direction DR1. The non-display region NDA may be defined to surround each of the right eye image display region R_DA and the left eye image display region L_DA as well as the space between the left eye image display region L_DA and the right eye image display region R_DA.

The right eye image display region R_DA may display the image to the user US in the right eye and the left eye image display region L_DA may display the image to the user US in the left eye.

According to this exemplary embodiment, the optical system OS may be disposed to be spaced apart from a display panel DP in the third direction DR3 in which an image is displayed. The optical system OS may be disposed between the display module DM and an eye US_E of the user US.

The optical system OS may enlarge the image from the display surface IS of the display module DM and provide the enlarged image to the user US. The optical system OS may include a right eye optical system OS_R and a left eye optical system OS_L. The left eye optical system OS_L may enlarge an image to provide the enlarged image to a left pupil of the user US, and the right eye optical system OS_R may enlarge an image to provide the enlarged image to a right pupil of the user US. In this exemplary embodiment, the optical system OS may include at least one convex spherical lens or at least one aspherical lens.

Other components of the display module DM are the same as the components of the display module in the above-described embodiments, and thus a description thereof will not be given.

Because the image from the display surface IS is enlarged by the optical system OS in the case of the head mounted display, a phenomenon that a non-light emitting region is visible to the user may be more conspicuous than in the exemplary embodiments described above that don't have a head mounted display. According to this exemplary embodiment, however, the phenomenon that the non-light emitting region is viewed from the outside may be alleviated even though the image of the display surface IS is enlarged by the optical system OS.

Hereinafter, a manufacturing method of a display device according to an exemplary embodiment of the inventive concept will be described with reference to the accompanying drawings.

FIGS. 19A to 19E are cross-sectional views sequentially illustrating some steps of the manufacturing method of the display device according to an exemplary embodiment of the present inventive concepts. FIGS. 19A to 19E focus on and illustrate the forming of a plurality of diffraction patterns in the manufacturing method of the display device according to an exemplary embodiment of the present inventive concepts. Hereinafter, components described above are denoted by the same reference numerals, and a description thereof will not be given.

Figure 19A:
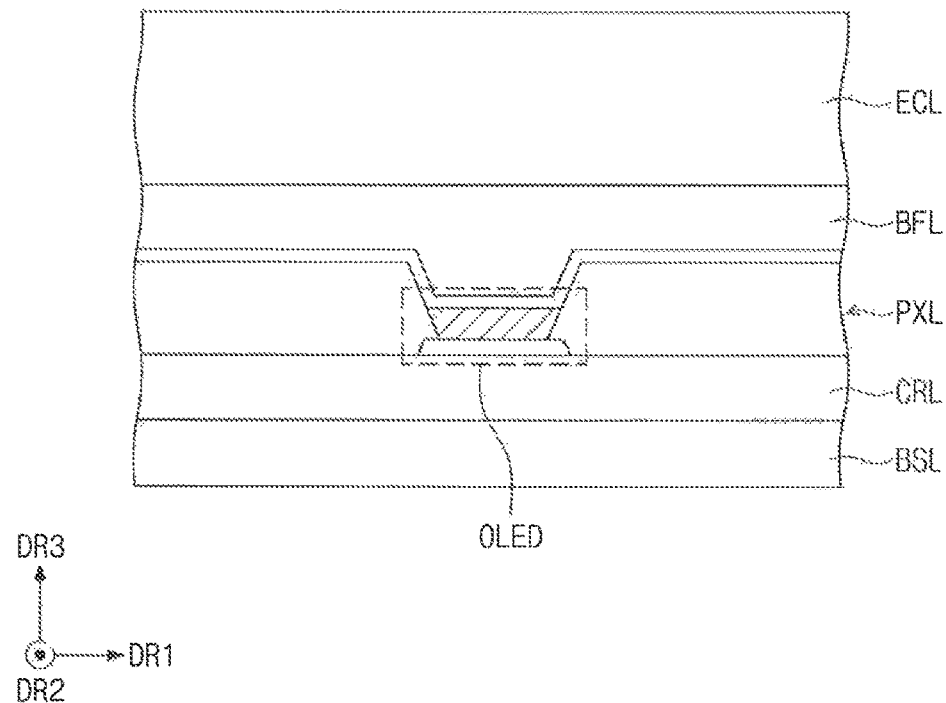
FIGS. 19A to 19E are cross-sectional views illustrating some steps of a manufacturing method of a display device according to an exemplary embodiment of the present inventive concepts.
Figure 19B:
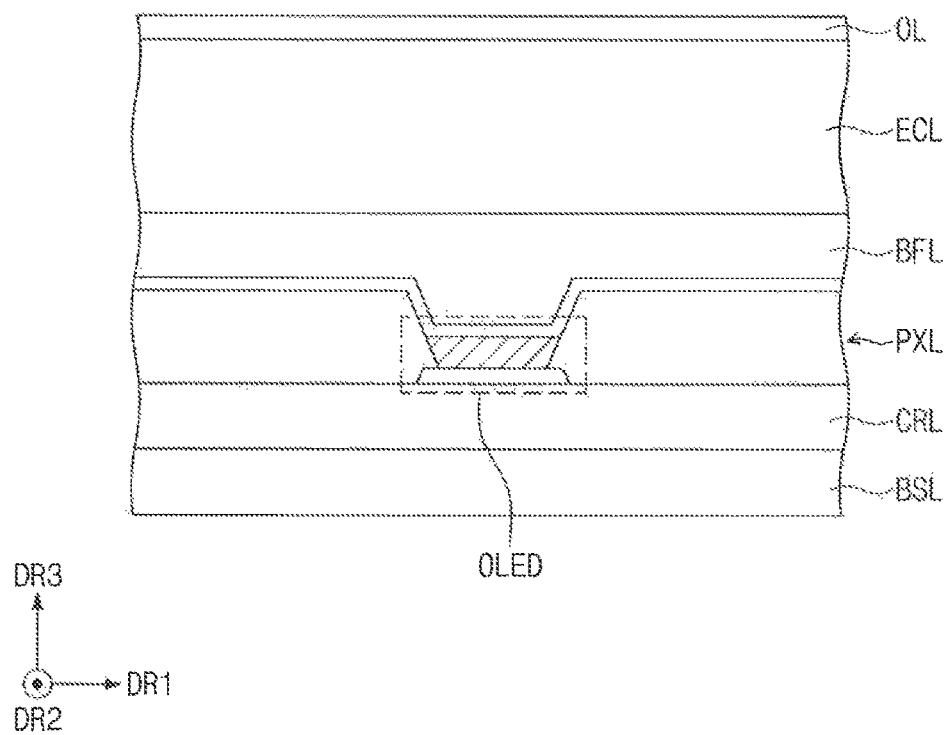

Referring to FIGS. 19A and 19B, the manufacturing method of the display device according to an exemplary embodiment of the present inventive concepts includes forming a plurality of display elements on a substrate. Hereinafter, the plurality of display elements are described as a plurality of organic light emitting elements OLED. However, the plurality of display elements is not limited thereto and various light emitting elements may be formed in the manufacturing method of the display device according to this exemplary embodiment.

The forming of the plurality of display elements may include providing a base layer BSL, forming a circuit layer CRL on the base layer BSL, and forming a pixel layer PXL including the organic light emitting elements OLED on the circuit layer CRL. The forming of the plurality of display elements may further include forming a buffer layer BFL on the pixel layer PXL.

The manufacturing method may include forming an encapsulation layer ECL on the plurality of organic light emitting elements OLED for covering the organic light emitting elements OLED. The encapsulation layer ECL may be a transparent insulating substrate. The forming of the encapsulation layer ECL may include bonding the transparent insulating substrate such as a glass substrate, a quartz substrate, and a transparent resin substrate by using a sealing member. The encapsulation layer ECL may be in the form of an alternate lamination of an inorganic layer and an organic layer. In this case, an inorganic layer may be formed at the top of the encapsulation layer ECL.

The manufacturing method of the display device according to an exemplary embodiment of the present inventive concepts includes coating a top surface of the encapsulation layer ECL with an organic material to form an organic film OL. The organic material is not particularly limited. The organic material may be used for forming the diffraction patterns, and may be selected depending on the wavelength of light to be diffracted. In an embodiment, the organic material may be an organic material including silicon (Si). In an exemplary embodiment, the organic material may include an acrylic or siloxane material. The organic material may include a photosensitive material.

Figure 19C:
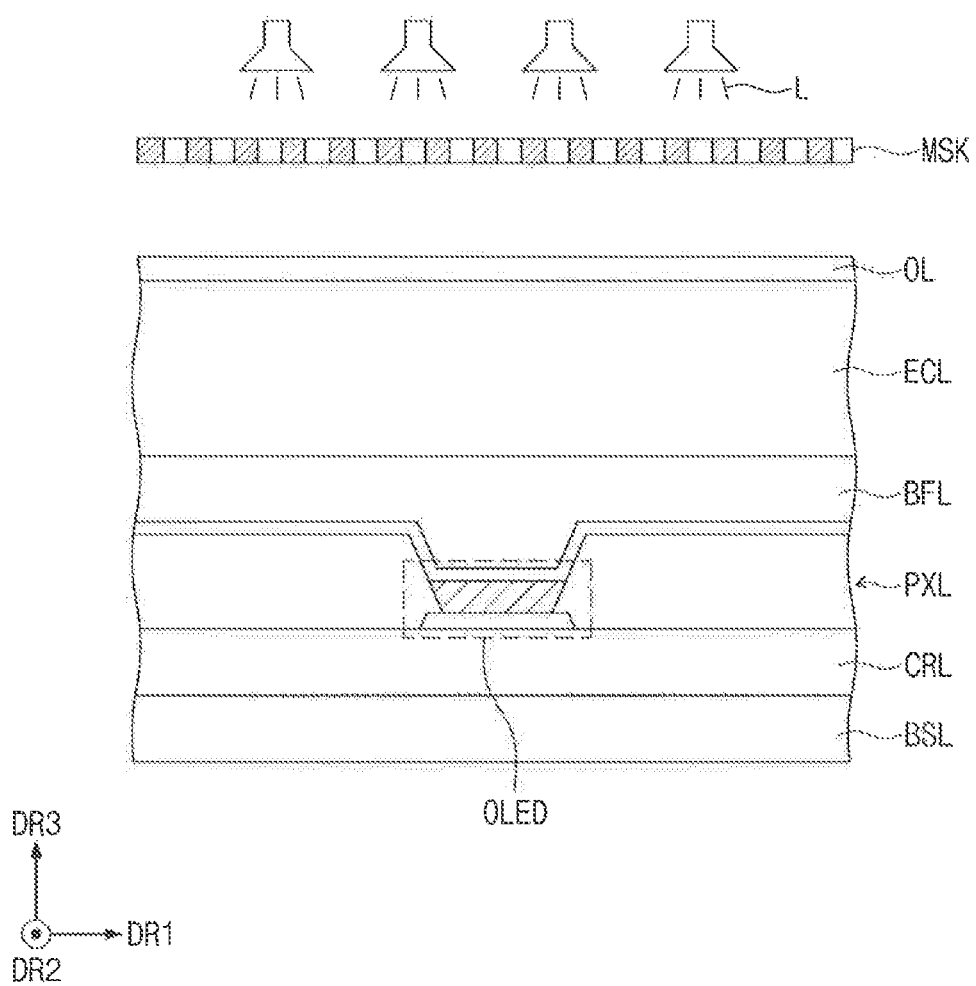
Figure 19D:
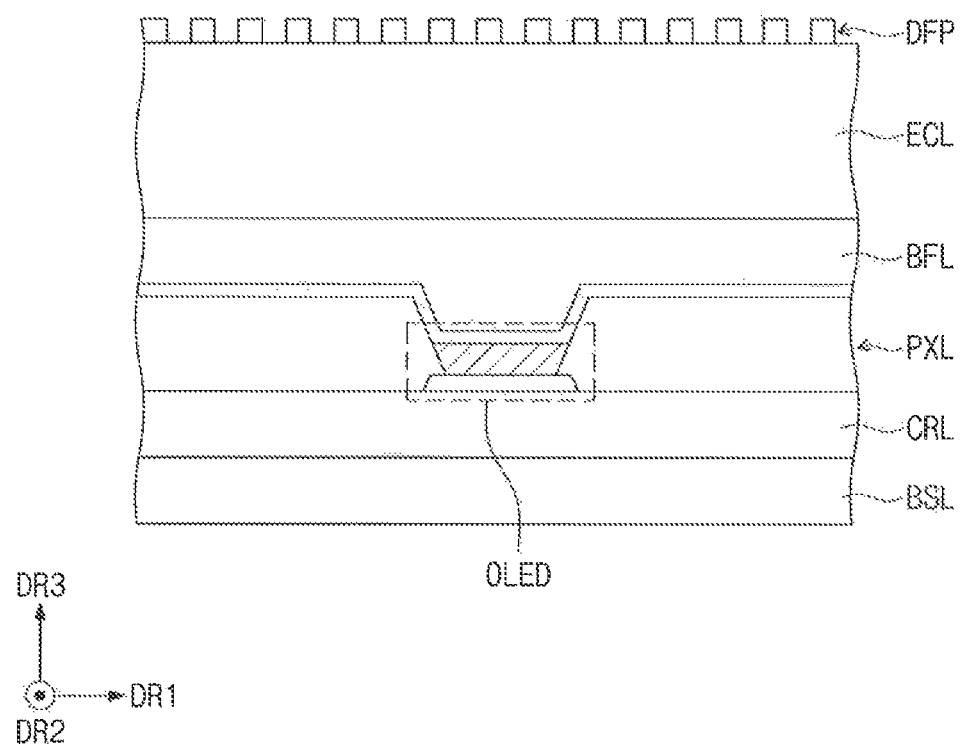

Referring to FIGS. 19C and 19D, the manufacturing method of the display device according to an exemplary embodiment of the present inventive concepts may include exposing a top surface of the organic film OL to light L through a mask MSK having openings formed at the constant intervals. In the exposing of the top surface of the organic film OL to the light L through the mask MSK, a plurality of diffraction patterns DFP arranged at constant intervals may be formed. In an exemplary embodiment, as the openings of the mask MSK are defined so as to be arranged at the constant intervals in a first direction DR1 and the organic film OL is exposed to the light L at the constant intervals in the first direction DR1, the plurality of diffraction patterns DFP may be patterned.

In an exemplary embodiment, the organic film OL may include a photosensitive material, and a positive photoresist may be used so that a region of the organic film OL exposed to the light L may be removed. Alternatively, a negative photoresist may be used so that a region of the organic film OL not exposed to the light L may be removed. In some exemplary embodiments, the mask MSK may also permit partial transmission of light L so that only portions of the photoresist may be removed.

When an inorganic film is formed using an inorganic material and then patterning the inorganic material to form a plurality of diffraction patterns, a separate process of a photosensitive pattern formation, a dry etching and a photosensitive pattern removal is required to form an inorganic film pattern. Therefore, the process may be complicated and damage to the encapsulation layer or the like may occur during the dry etching process. Further, when the photosensitive pattern is removed, damage to the plurality of diffraction patterns may occur, resulting in reduced optical efficiency of the display device.

In the manufacturing method of the display device according to an exemplary embodiment of the present inventive concepts, the plurality of diffraction patterns formed on the display elements for diffracting light generated in the display elements may be formed using the organic material. More specifically, in the manufacturing method of the display device according to an exemplary embodiment of the present inventive concepts, the organic film may be formed on the display elements using the organic material. The organic film may be patterned through photolithography or the like to form the plurality of diffraction patterns. As the plurality of diffraction patterns are formed using the organic material in the manufacturing method of the display device according to an exemplary embodiment of the present inventive concepts, the steps of forming and removing a separate photosensitive pattern and a dry etching process for etching the inorganic film may be omitted. Therefore, the process may be simplified and foreign matter generated in the process may be prevented. Further, because damage to the encapsulation layer and the plurality of diffraction patterns may be prevented by omitting steps of the process, the optical efficiency of the display device may be improved.

Figure 19E:
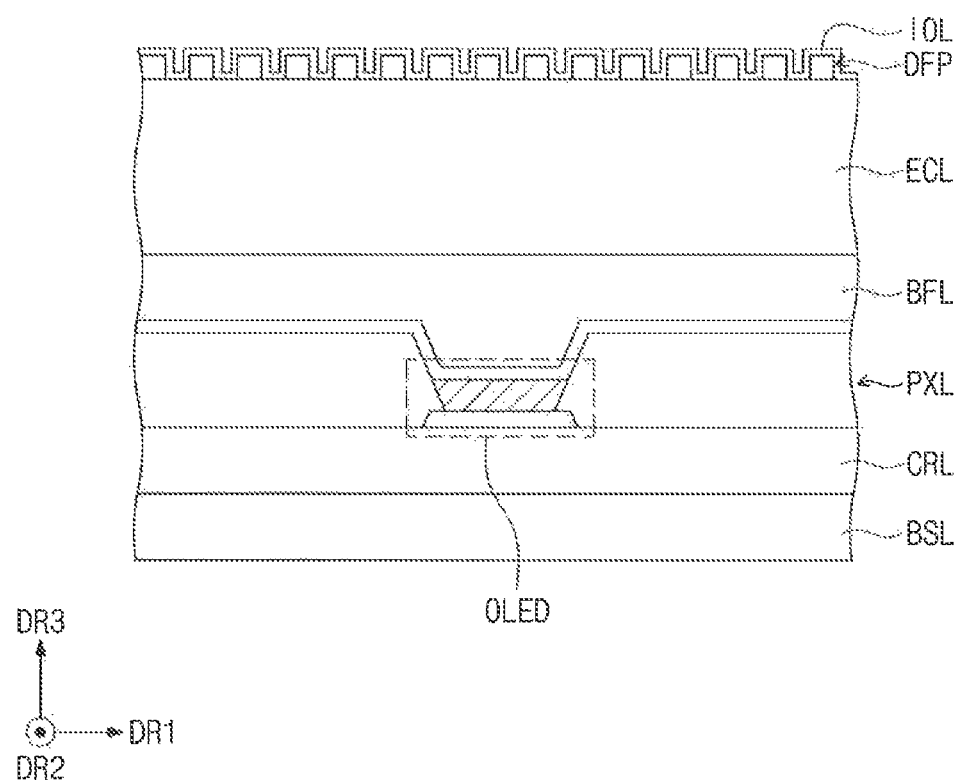

Referring to FIG. 19E, the manufacturing method of the display device according to an exemplary embodiment of the present inventive concepts may further include forming an inorganic film IOL by depositing an inorganic material on the plurality of diffraction patterns DFP. The inorganic material may include at least one of silicon nitride ($SiN_x$), silicon oxide ($SiO_x$), or silicon oxynitride ($SiO_xN_y$). In an exemplary embodiment, damage to the plurality of diffraction patterns DFP including the organic material due to a condition such as a high temperature condition that may occur in a subsequent process may be prevented by the forming of the inorganic film IOL covering the plurality of diffraction patterns DFP.

According to an exemplary embodiment of the present inventive concepts, by forming the diffraction patterns using the organic material instead of an inorganic material, the process steps of forming the diffraction patterns may be reduced, and the diffraction patterns and the sealing member may be prevented from being damaged. Accordingly, the process of manufacturing the display device may be simplified, resulting in the reduction of cost, and an improved reliability and image quality of the display device.

Although the exemplary embodiments of the present inventive concepts have been described herein, it is understood that various changes and modifications can be made by those skilled in the art within the spirit and scope of the inventive concept defined by the following claims or the equivalents.

Therefore, the scope of the inventive concept is to be determined by the broadest permissible interpretation of the following claims and their equivalents, and shall not be restricted or limited by the foregoing detailed description.

What is claimed is:

1. A display device comprising a display module configured to define a display surface,
    wherein the display module comprises:
    a display panel including a plurality of display elements configured to display an image on the display surface;
    a plurality of diffraction patterns spaced apart on the display panel at a constant interval, the diffraction patterns configured to diffract at least some light beams emitted from the plurality of display elements; and
    an encapsulation layer disposed between the plurality of display elements and the plurality of diffraction patterns, the uppermost surface of the encapsulation layer is an inorganic layer, wherein a lowermost surface of the plurality of diffraction patterns directly contacts the uppermost surface of the encapsulation layer,
    wherein the plurality of diffraction patterns comprises an organic material.

2. The display device of claim 1, wherein the at least some of the light beams diffracted by the plurality of diffraction patterns interfere constructively.

3. The display device of claim 2, wherein
    the plurality of display elements are configured to display pixel unit images on the display surface,
    the light beams that have interfered constructively are configured to display one or more duplicate unit images on the display surface adjacent the pixel unit images,
    wherein the image is defined by the pixel unit images and the duplicate unit images.

4. The display device of claim 1, wherein each of the plurality of display elements comprises an organic light emitting element.

5. The display device of claim 1, wherein the encapsulation layer comprises at least one of an organic layer and an inorganic layer.

6. The display device of claim 1, wherein the encapsulation layer is a glass substrate.

7. The display device of claim 1, further comprising an optical system disposed in a path of light emitted from the display module and configured to enlarge the image;
    wherein the display surface comprises a left eye image display region and a right eye image display region.

8. The display device of claim 1, wherein the plurality of diffraction patterns are arranged side by side and are spaced apart at a constant interval in a first direction and a second direction crossing the first direction.

9. The display device of claim 1, wherein the plurality of diffraction patterns are arranged side by side and are spaced apart at constant intervals in a first direction, and are alternately arranged in a second direction crossing the first direction.

10. The display device of claim 1, further comprising an inorganic film configured to cover the plurality of diffraction patterns.

11. The display device of claim 1, wherein each of the plurality of diffraction patterns has a cylindrical shape, a square pillar shape, or an engraved cylindrical shape.

12. The display device of claim 1, wherein
    the plurality of diffraction patterns are spaced apart from adjacent diffraction patterns on the display panel at first intervals in a first direction, and
    the plurality of display elements are spaced apart from adjacent display elements of the display panel at second intervals in the first direction,
    wherein each of the first intervals is smaller than each of the second intervals.

13. The display device of claim 1, further comprising a cover layer configured to cover the plurality of diffraction patterns and to planarize a top of the plurality of diffraction patterns.

14. The display device of claim 1, wherein the plurality of diffraction patterns is formed by patterning an organic film disposed on the uppermost surface.

* * * * *